(12) United States Patent
Fuse

(10) Patent No.: US 6,452,132 B1
(45) Date of Patent: Sep. 17, 2002

(54) LASER HOLE BORING APPARATUS

(75) Inventor: Keiji Fuse, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 6 days.

(21) Appl. No.: 09/598,467

(22) Filed: Jun. 22, 2000

(30) Foreign Application Priority Data

Jun. 23, 1999 (JP) ............................................ 11-177376
May 25, 2000 (JP) ........................................ 2000-154514

(51) Int. Cl.$^7$ ..................... B23K 26/067; B23K 26/38; G02B 5/18
(52) U.S. Cl. ............................... 219/121.7; 219/121.73; 359/569
(58) Field of Search ......................... 219/121.7, 121.71, 219/121.73, 121.75; 359/569, 206, 662

(56) References Cited

U.S. PATENT DOCUMENTS

| | | | | |
|---|---|---|---|---|
| 4,265,254 A | * | 5/1981 | Koch et al. | |
| 4,846,550 A | * | 7/1989 | Schuma et al. | |
| 5,093,749 A | * | 3/1992 | Maeda | |
| 5,113,286 A | * | 5/1992 | Morrison | 359/569 |
| 5,353,164 A | * | 10/1994 | Sasian-Alvarado | |
| 5,362,940 A | * | 11/1994 | MacDonald et al. | 219/121.73 |
| 5,373,137 A | * | 12/1994 | McLaughlin | |
| 5,481,407 A | * | 1/1996 | Smith et al. | |
| 5,670,069 A | * | 9/1997 | Nakai et al. | 219/121.73 |
| 5,690,846 A | * | 11/1997 | Okada et al. | 219/121.71 |
| 5,922,224 A | * | 7/1999 | Broekroelofs | |
| 6,037,564 A | * | 3/2000 | Tatah | 219/121.7 |

FOREIGN PATENT DOCUMENTS

| | | | |
|---|---|---|---|
| JP | 9-89668 A | * | 4/1997 |
| JP | 2723798 | | 11/1997 |
| JP | 11-245070 A | * | 9/1999 |
| WO | WO-01/14836 A1 | * | 3/2001 |

OTHER PUBLICATIONS

Thibault, "F–Sin(theta) lens system and applications",Jul.–2001, Proceedings of SPIE, vol. 4441, pp. 98–105.*

* cited by examiner

Primary Examiner—Geoffrey S. Evans
(74) Attorney, Agent, or Firm—McDermott, Will & Emery

(57) ABSTRACT

A laser hole boring apparatus comprising a galvanomirror beam scanning system, a DOE beam diffraction system and a selecting device for the two systems optionally. The DOE system bores many holes simultaneously on printed circuit boards or packages by converting a laser beam into two dimensional diffraction beams and converging the diffraction beams by an f sin θ lens into spots on the object (board, package). The galvanomirror system bores many holes sequentially on printed circuit boards or packages by scanning a pulse laser beam in two dimensions and converging the scanned beam by an f sin θ lens into a spot on the object.

14 Claims, 16 Drawing Sheets

PRIOR ART   DOE

3 Rings R=0.3357, 0.7071, 0.9420

6 Arms θ= 0°, 60°, 120°
180°, 240°, 300°

● $w_j$= 0.048481    12

◉ $w_j$= 0.07757    6

LASER HOLE BORING APPARATUS

BACKGROUND OF THE INVENTION

1. Field of the Invention

This invention relates to a laser hole boring (drilling) apparatus for printed circuit boards or packages. The printed circuit board of electronic apparatuses is equipped with tiny electronics devices, e.g., ICs, LSIs, capacitors, resistors or so. For mounting the electronic devices, plenty of pin holes are bored through the printed circuit board. At present, the holes of the printed circuit board are bored one by one by a mechanical drilling apparatus which repeats the operation of moving a rotating microdrill to a determined spot, lowering the microdrill onto the spot of the object printed circuit board, boring a hole and raising the microdrill.

The mechanical boring is endowed with flexibility. The mechanical processing is preferable for the purpose of perforating holes of a small number of products having various dispositions of holes. The prevalent boring method is still the mechanical boring. The mechanical processing has a drawback of low drilling speed, because the microdrill bores holes one by one.

This application claims the priority of Japanese Patent Application No. 11-177376 (177376/1999) filed Jun. 23, 1999 and No.2000-154514 (154514/2000) filed May 25, 2000 which are incorporated herein by reference.

2. Description of Related Art

In the description, the word "ray" means an individual line representing an optical path of light. A beam is an assembly of rays which starts from a point, travels along different paths and converges at another point. The beam is a collective concept. The ray is an individual concept. But a beam can be drawn by a line. The light packets which have different starting points or different converging points cannot be deemed as a beam. The beam should be discriminated from the ray. Raising mounted device density and multilayered wiring of recent printed circuit boards requires to bore smaller diameter holes. Packages for semiconductor devices require plenty of microholes boring. For example, less than 0.15 mm of a hole diameter will be required in near future. It is difficult to bore such a small hole by the mechanical drilling. The small hole diameter requires a smaller drill diameter. Such a small diameter deprives the drill of the strength of maintaining itself as a tool. A promising candidate of perforating such small holes is an optical boring by laser beams. This invention aims at providing a high speed laser boring apparatus which is preferable f or mass production of a small number of types of printed circuit boards.

A laser beam scanning boring method using a laser, galvanomirrors and lenses has been proposed as a new boring method which will be faster than the present mechanical boring method. This method uses a pulse laser beam of a high power laser, for example, a $CO_2$ laser. The laser beam scanning boring apparatus perforates holes one by one by the steps of swaying galvanomirrors by a unit angle, reflecting a pulse laser beam by the galvanomirrors, converging the beam on a point of a printed circuit board by a lens and burning out a hole through the board by heat in an instant. This method scans on an object printed circuit board with a pulse laser beam by deflecting the laser beam in two directions perpendicular with each other by two galvanomirrors which sway in definite amplitudes with predetermined speeds around different axes vertical to each other. Since the laser generates a pulsed beam, the pulsed laser beam perforates small holes at discrete, predetermined spots despite the continual oscillation of the galvanomirrors.

The laser beam scanning boring method can perforate smaller holes at a faster rate than the mechanical drilling, since a small pulse beam converged by the lens burns small areas of the board. The laser beam scanning method is a promising, novel boring method which will be realized in near future. However, the Inventor of the present invention is aware that this novel laser beam scanning method would have some problems.

A first problem is the converging lens. A conventional and traditional lens has an action of converging rays of a beam together on a spot of an image plane distanced by a focal length from the lens. A perpendicularly incident beam is converged onto the center of the image plane. Another beam slanting at an angle θ to the optical axis is converged on a spot distanced by f tan θ from the center of the image plane. The distance of an image spot from the center on the image plane is here defined as a "height" of the image spot. Since the height of the spot image of a θ inclining beam is f tan θ, the conventional, traditional lens can be called here an "f tan θ" lens.

When the galvanomirrors scan a single laser beam in the x-direction and in the y-direction at a constant rate, the velocity of the swaying angle θ is constant. The interval between the neighboring holes on the board should be constant. The conventional f tan θ lens cannot satisfy such a linear relation h=fθ between the angle θ and the spot height h. The beam of an incidence angle θ should make an image at a spot of a height of fθ by a lens for boring holes at a constant interval. Instead of conventional traditional lenses, the laser beam scanning method requires a special lens which makes θ inclining rays converged on a spot image of an fθ height (h=fθ) on the image plane. Such a lens is called an "fθ" (f-theta) lens. The fθ lens is different from the conventional lenses. The fθ lens which is realized by an assembly of plurality of lenses requires a special design for giving the fθ property.

Another problem of the laser beam scanning method is the orthogonality of the beam to the board. The scanned beam should always be vertical to the board for boring holes perpendicular to the board. Although the incident beams are slanting to the lens axis and pass the lens at non-central point, the beams must construct a outgoing, convergent beam perpendicular to the board. This is a very difficult property for a conventional lens to realize. The property that slantingly-incident beams are converted into a vertical converging beam by a lens is called "telecentricity" or "telecentric property". The laser beam scanning boring method by the galvanomirrors requires the "fθ property" and the "telecentricity" for the converging lens.

It is expected that the galvanomirror laser beam scanning boring method by the galvanomirrors and the fθ lens would enable the hole boring processing on printed circuit boards or on IC packages to perforate up to 500 holes per a second. FIG. 1 shows a schematic view of the laser beam scanning boring apparatus which will be applied to an actual processing in near future. A laser beam 1 is once reflected by an x-axis scanning galvanomirror 2. The laser beam is again reflected by a y-axis scanning galvanomirror 3. The x-axis scanning galvanomirror 2 sways along the x-axis. The reflected beam sways right and left in the x-direction in a definite amplitude with determined timing. The y-axis scanning galvanomirror 3 sways along the y-axis. The reflected beam sways up and down in the y-direction in a definite amplitude with determined timing. The timing of moving in the x- and y-directions depends upon the mode of the scanning.

The twice reflected beam scans horizontally and vertically on a lens 4. The lens 4 converges the beam on a printed circuit board 5. Since the beam runs both in the x-direction and in the y-direction and the laser emits a pulsed beam, the apparatus can perforate a lot of holes 6 aligning their locations in the x-direction and in the y-direction at an ultrahigh speed. The laser beam scanning boring method will make big progress over the current mechanical drilling in speed in near future. Practical models have been produced for galvanomirrors of small inertia and galvanometers for oscillating the mirror at a high speed. The far-infrared lenses have been designed and prepared for $CO_2$ lasers.

However, a request for perforating holes at a higher speed than the laser beam scanning boring method is suggested. The upper limit of the laser beam scanning boring method is thought to be 500 holes per second at most. The laser beam scanning method cannot perforate more than one hole simultaneously, since the method uses a single beam essentially. The request is to perforate several thousands of holes per second which could be satisfied neither by the current mechanical drilling nor by the current proposed laser beam scanning boring method. The laser beam scanning boring method which scans a laser beam by oscillating mechanically the galvanomirrors will be unable to catch up with the request of an increasing number of holes bored per second.

A DOE (Diffractive Optical Element) is proposed for an optical element for dividing a single laser beam into many beams having desired spatial (angular) distribution by utilizing the diffraction phenomenon. Unlike the beam scanning boring method by the galvanomirrors, the DOE method uses many beams for perforating many holes simultaneously. The DOE is explained by referring to FIGS. 3, 4 and 5. FIG. 3 is a plan view of a DOE. FIG. 4 is a plan view of a unit pattern. FIG. 5 is an L—L section of FIG. 4. A DOE 8 is a plate transparent to the object light. The DOE is divided into plenty of unit square or rectangular patterns aligning crosswise and lengthwise. Every unit pattern 9 is further divided into many pixels 10 by horizontal lines and vertical lines. The thicknesses of the pixels are diversified into $2^m$ (m=1,2,3, . . . ) steps with a primary unit of $\lambda/(n-1)2^m$. The diversification aims at dividing a thickness equivalent to a single wavelength optical path into $2^m$ steps. Then, the distribution of the thickness corresponds to the phase distribution of DOE, which modulates the phase of the incident light passing through the DOE.

FIG. 5 shows the simplest example of binary step type (m=1) which diversifies the thickness into binary steps in which the phase difference is 180 degrees, a half of the wavelength. There are only two different heights of steps. The unit pattern 9 has higher (thicker) pixels 11 and lower (thinner) pixels 12. The thicker pixel induces a half wavelength phase delay from the thinner pixels. The thickness distribution determines the diffraction pattern being made by the DOE on the image plane. The distribution of the pixels diffracts the laser beam into the whole directions for making a desired spot array pattern on the image plane.

All the unit patterns 9 have the same thickness distribution of pixels. Namely, the DOE is an assembly of the same unit patterns aligning in two dimensions. Thus, the scope of designing is restricted within a unit pattern. The length of the side of the unit pattern 9 is the period $\Lambda$ of the phase distribution of the DOE. Repetition of the same patterns plays an important role in diffraction phenomena, as described later in detail. The spatial period $\Lambda$ determines the divergence of the diffraction angles. A smaller period $\Lambda$ corresponds to bigger diffraction angles. A bigger spatial period $\Lambda$ corresponds to smaller diffraction angles.

The unit pattern restricts the scope of the phase (thickness) variables. Namely, the variables are the distribution of phase in a unit pattern of the DOE. Two dimensionally diverging diffraction beams are made by giving two dimensional distribution of the phase differences to the pixels in a unit pattern. A square unit pattern ($\Lambda \times \Lambda$) can equalize the unit diffraction angles for both the x- and y-directions. Otherwise, a rectangle unit pattern ($\Lambda_x \times \Lambda_y$) can differ the unit diffraction angles for the x-direction and y-direction. An arbitrary diffraction beam distribution is realized by determining the size of a pixel and the thickness (phase) distribution of pixels. The DOE can make an arbitrary number M of beams from a single beam by diffraction unlike the single beam of the galvanomirror method. The DOE is not moved unlike the galvanomirrors. The DOE is static. Despite the static feature, the DOE can simultaneously perforate many holes by many divided beams. The many divided beams are converged by a lens and irradiate on an object printed circuit board or an object device package.

A new problem appears with regard to the lens for converging the multiple beams produced by the DOE. An conventional traditional lens is an f tan θ lens. It has been explained that the galvanomirror beam scanning boring apparatus should employ not an conventional f tan θ lens but an fθ lens. The galvanomirror has the least unit Δ of a swaying angle for a pulse interval. The swaying angle at the instant of pulsation should be a product mΔ of an integer m and the least unit Δ. The fθ lens is the best lens for the galvanomirror scanning boring apparatus for boring holes at a constant interval.

An fθ lens is composed mainly of five lenses or four lenses for satisfying the fθ c property, the telecentricity and the diffraction limited convergence. At least two lenses are required for building an fθ lens. FIG. 2 shows a simple example of an fθ lens having two lenses including a first lens L1 and a second lens L2. The first lens L1 has a front surface S1 on the object side and a rear surface S2 on the image side. The second lens L2 has a front surface S3 on the object side and a rear surface S4 on the image side, The first lens L1 is a spherical lens. The second lens L2 has a spherical front surface S3 and an aspherical rear surface S4 in this example. The sign (plus or minus) of a curvature of a lens surface is defined to be positive for the center of the curvature lying on the image side and to be negative for the center lying on the object side. The aspherical surface is expressed by the lens surface height (sag) Z(r) as a function of the radius r. Eq.(1) is the definition of the height Z(r), where c, k and $\alpha_j$ are parameters. The number j increases by one from 1 to s (integer). The upper limit number s is determined for obtaining the expected performance. In the example, the upper limit is s=5.

$$Z(r) = \frac{cr^2}{1 + \{1 - (1+k)c^2 r^2\}^{\frac{1}{2}}} + \sum_{j=1}^{s} \alpha_j r^{2j}. \tag{1}$$

TABLE 1 f θ lens data

| Lens No. | Surface No. | Curvature Radius (mm) | Thickness, Spacing | Refractive Index |
|---|---|---|---|---|
| L1 | S1 | −32.473 | 6.184 | 2.403 |
|  | S2 | −37.790 | 62.114 |  |
| L2 | S3 | −3848.615 | 11.702 | 2.403 |
|  | S4 | Table.2 | 158.588 |  |

Table 1 denotes the data (lens number; surface number; curvature radius; thickness, spacing; and refractive index) of the example fθ lens.

The thickness, spacing means a center thickness of the lens, a center distance between the lenses, or a center distance between the lens and the image. For example, 65.114 mm is the distance between S2 of L1 and S3 of L2. S1, S2 and S3 are spherical. S4 is aspherical 158.588 mm is the distance between S4 of L2 and the image plane I. The light source is the $CO_2$ laser emitting coherent light of a 10.6 µm wavelength. The lens is made of ZnSe which is transparent for the infrared (10.6 µm) light. The refractive index is defined to the far infrared light.

TABLE 2

Aspherical lens data of surface S4

| Surface No. | S4 | | Aspherical Coefficient |
|---|---|---|---|
| 1/c (mm) | −169.837 | $\alpha_2$ | $1.217 \times 10^{-9}$ |
| k | −1.060 | $\alpha_3$ | $-2.528 \times 10^{-12}$ |
| | | $\alpha_4$ | $1.383 \times 10^{-15}$ |
| | | $\alpha_5$ | $-2.550 \times 10^{-19}$ |

Table 2 shows the data for the aspherical surface S4.

If the fθ lens were adopted into the DOE apparatus, multiple beams divided into by the DOE would be individually converged on the image plane by the fθ lens. The spot positions are determined by the slanting (diffraction) angles of the individual beams. However, the Inventor is aware that the fθ lens is not the best choice for the DOE.

The reason why the fθ is not the best choice is explained as follows. The DOE defines pixels in definite spatial periods for making diffraction beams by modulating the phase of the passing light by the variation and the distribution of step heights (thicknesses). Instead of random distribution of thickness, the DOE consists of the equivalent patterns having regularly arranged pixels. Thus, restrictions are imposed upon the lens.

A parallel beam is assumed to enter the DOE at right angles. In the case of Fraunhofer type DOE, each of the divided beams is still a parallel beam, although all the diffracted beams are no longer parallel to the optical axis. The parallel beams do not converge without a lens. Thus, the DOE requires a lens for converging different diffraction order beams on an image plane at a rear focal point. Since all the diffraction beams consist of parallel rays, all order diffraction rays converge on the same plane by the lens. Namely, the DOE divides a single laser beam into divided diffraction beams and the lens converges all the divided beams into discrete spots on the image plane I.

The incompetence of the fθ lens will be explained more in detail. λ is a wavelength of the laser light. Λ is a spatial period of the unit pattern. The order of diffraction is denoted by "n". The n-th order diffraction beam is inclined at $\theta_n$ n to the optical axis. Namely, $\theta_n$ is the diffraction angle of the n-th order beam. The equation for diffraction is denoted by $$\theta_n = n\lambda. \tag{2}$$

The inclination angle $\theta_n$ ( of the n-th order diffraction beam is determined by $$\theta_n = \sin^{-1}(n\lambda/\Lambda). \tag{3}$$

The n-th order beam goes into the lens at the inclination angle $\theta_n$. The height $h_n$ of the n-th order diffraction beam depends on the kind of the lens.

(1) in the case of a conventional f tan θ lens $$h_n = f \tan\{\sin^{-1}(n\lambda/\Lambda)\} \tag{4}$$

(2) in the case of an fθ lens that is the same one applied to the galvanomirror scanning boring apparatus $$h_n = f \sin^{-1}(n\lambda/\Lambda) \tag{5}$$

In any case, the image height $h_n$ on the image plane is not in proportion to the diffraction order n. The relation between n and $\theta_n$ deviates from the linear relation.

$$\tan(\sin^{-1}x) = x + (x^3/2) + (3x^5/8) + \tag{6}$$

$$\sin^{-1}x = x + (x^3/6) + (3x^5/40) + \tag{7}$$

The deviation from the linearity appears in the terms higher than the third order of x. In Eq.(6) and Eq.(7), $x = n\lambda/\Lambda$. If Λ is large and n is small, the deviation from the linearity may be negligible. On the contrary, if Λ is small and n is large (higher order diffraction), the deviation from the linearity cannot be neglected.

Comparison of two lenses teaches us that the deviation from the linearity is smaller for the fθ lens than the f tan θ lens. The fθ lens is better than the f tan θ lens in the viewpoint of the linearity. The fθ lens is, however, not the best lens for the DOE system yet. It is not the best choice of diverting the fθ lens suitable for the galvanomirror beam scanning method to the DOE system. An ideal lens should be a lens giving linearity to the relation between sin $\theta_n$ and the $h_n$. The lens is novel itself. There is neither a concept nor a name. Thus, a name should be given to the new lens. Such a lens may be called an "f sin θ lens". If such an f sin θ lens were to be made, the lens would realize the following convenient relation.

(3) Assuming that the new f sin θ lens which is proposed first by the present invention would be positioned behind the DOE, the height of the n-th order diffraction beam is given by, $$h_n = f\sin\{\sin^{-1}(n\lambda/\Lambda)\} \tag{8}$$

$$= fn\lambda/\Lambda. \tag{9}$$

If the f sin θ lens could be produced, the f sin θ lens would be the best lens for the DOE system. If the f sin θ lens were produced and used for the DOE, the interval $d_n = h_n - h_{n-1}$ between the nearest neighboring diffraction spots $h_n$ and $h_{n-1}$ should be constant irrespective of the diffraction order n.

$$d_n = f\lambda/\Lambda. \tag{10}$$

Three different kinds of lenses have been compared with regard to the linearity between n and $h_n$ of the diffraction pattern on the image plane. If only the paraxial beams were dealt with, an f tan θ lens, an fθ lens and an f sin θ lens would make little difference. If θ is small enough, approximate equations hold between sin θ, tan θ and θ within a small error, $$\sin\theta_n = \tan\theta_n = \theta_n. \tag{11}$$

For example, if the DOE diffraction system uses a $CO_2$ laser of λ=10.6 µm as a light source, a lens of a focal length f=127 mm and a unit pattern of Λ=2.688 mm, the interval is d=0.5 mm. In this case, even the seventh order diffraction beam has a small diffraction angle $\theta_7$=1.6 degrees. The paraxial approximation is valid for the case. The conventional f tan θ lens is applicable to the case of a small diffraction angle. However, if the diffraction angle is large, the f tan θ would cause too large errors and even the fθ lens would bring about big errors.

One purpose of the present invention is to provide a laser hole boring apparatus for boring many holes at a high speed by the DOE. Another purpose of the present invention is to provide a laser hole boring apparatus for boring a lot of holes widely-spread within a large processing Area, utilizing large diffraction angles of higher order diffraction of the DOE. A further purpose of the present invention is to provide a laser hole boring apparatus for boring many holes with the DOE and the f sin θ lens for suppressing the errors of higher order diffraction beams.

SUMMARY OF THE INVENTION

The laser hole boring apparatus of the present invention comprises a laser, a diffractive optical element (DOE) having on its surface a microstructure, which is formed by the repetition of similar patterns with a definite spatial period, or by the modulation of the repeated patterns for diffracting the laser beam into a plurality of diffraction beams, and an f sin θ lens for converging the divided beams on an image plane.

Namely, the new laser beam diffraction apparatus has a large power laser, a DOE for making divided multibeams by diffracting the laser beam and an f sin θ lens of converging each divided beam at a determined spot for boring many holes simultaneously.

FIG. 11 shows a schematic view of the laser hole boring apparatus of the present invention. A wide parallel beam 1 is made by a beam expander from a beam emitted from a laser. The wide beam shoots the DOE 8. The DOE 8 makes many diffraction beams 13 with different diffraction angles of two dimensional distribution. Each beam 13 consists of parallel rays. The parallel rays 13 are converted into converging rays 17 by a lens 14. The assembly of the converging rays is called a converging beam. A package 15 is placed at the focus of the lens. The package 15 is an image plane. The many converging beams 17 burn out small holes 16 at the converging spots on the package 15. The beam inclining at θ converges at a spot of a height f sin θ. The DOE 8 enables the apparatus to bore many holes simultaneously by making plenty of diffraction beams.

It is important to adopt an f sin θ lens as a convergence lens. The f sin θ lens is a novel lens, which is first proposed by the Inventor, for converging rays going at an angle θ at a height of h=f sin θ. The f sin θ lens is different from the conventional f tan θ lens or from the galvanomirror-preferable fθ lens.

Diffraction enables a DOE to convert a single beam into many beams directing in different directions. It is a convenient property of the DOE. The DOE is superior in the yield of boring many small holes to the mechanical drilling or the galvanomirror scanning apparatus. However, the DOE is a permanent device having a definite distribution of the thickness. The DOE makes a definite diffraction beam distribution which cannot be changed in any case. The DOE lacks flexibility. This is a drawback of the DOE boring method. The DOE cannot satisfy the requirement of boring holes of different distributions.

The rigidity is the drawback of the DOE multibeam boring method. The sturdy rigidity prevents the DOE method from being an alternate of the prevalent mechanical drilling. Flexibility should be given to the DOE boring method for employing the DOE boring method as a practical apparatus for boring holes on printed circuit boards or packages. The Inventor has an idea of an improvement for changing the DOEs easily. The improvement can change the hole distribution patterns easily by preparing a rotatable disc having a plurality of windows in the angular direction, making different DOEs, mounting the different DOEs in the windows and rotating the disc for choosing an optimum DOE. When k kinds of DOEs are put on m windows (m>k), the DOE apparatus can perforate k different patterns of holes on an object board or an object package at ultrahigh speed.

For compensating the DOE apparatus by endowing further flexibility, the Inventor thinks of hybridizing the DOE apparatus with the galvanomirror scanning apparatus. The galvanomirror scanning method can perforate holes at faster speed than the current prevalent mechanical drilling. The galvanomirror is rich in freedom and flexibility for perforating various distributions of holes. High degree of freedom enables the galvanomirror method to change the speed, the amplitude, the timing and the pulsation interval of the scanning. Free choice of the variables allows the galvanomirror method to make arbitrary distribution patterns of holes. The galvanomirror can respond the change of the size of the board or the change of the interval of holes easily. The DOE is inferior in flexibility to the galvanomirror method but superior to the galvanomirror method in speed. The hybridization of the galvanomirror and the DOE would be able to obtain high speed and rich flexibility applicable to any distribution patterns of holes.

The hybrid-type of the laser hole boring apparatus of the present invention comprises a laser, at least two galvanomirrors swaying in different directions, a diffractive optical element (DOE) having on its surface a microstructure formed by the repetition of similar patterns with a definite spatial period, or by the modulation of the repeated patterns for diffracting the laser beam into a plurality of diffraction beams, an f sin θ lens for converging the divided beams on an image plane, and a device for inserting the DOE into the path of the laser beam or taking off the DOE from the path of the laser beam. Both the galvanomirror scanning and the DOE diffraction are included in the hole boring apparatus of the present invention. When the galvanomirror scanning is adopted, the DOE should be removed from the optical path of the laser beam. When the DOE is employed, the galvanomirror should be stopped in the neutral, rest position.

The hybrid-type boring apparatus of the present invention allows the DOE to intervene in any part of the beam path. For example, an isolated single DOE is optionally put into or got rid of from the middle point between two galvanomirrors.

Otherwise, another apparatus will be realized by a rotatable disc with a plurality of windows having different DOEs interposed in the beam line. Different DOEs can be replaced by rotating the disc.

Alternatively, a further apparatus will be accomplished by a rotatable disc having a plurality of windows having different DOEs and an open aperture interposed in the beam line. Different DOEs and galvanomirror system can be alternatively changed. FIG. 12 denotes the apparatus having the rotating disc of the DOEs and the galvanomirror system. A parallel laser beams is emitted by a $CO_2$ laser (not shown in the figure). The laser beam 1 is reflected and deflected by an x-scanning galvanomirror 2. Next, the x-deflected beam 18 is reflected and deflected by a y-scanning galvanomirror 3. A rotatable disc 19 is furnished in the intermediate beam 18 between the galvanomirrors 2 and 3. The rotatable disc 19 has a plurality of round windows 20 in the angular direction. Several DOEs 8a, 8b and 8c are fitted in the windows 20. Some windows are left open without DOE. The open windows are provided for making use of the galvanomirror scanning system. When the DOE 8 is used, the galvanomirror is at rest at the middle, neutral position.

Furthermore, the size of the hole arrangement patterns can be enlarged or shrunk by installing a device for adjusting the divergence angle of the laser beam between the DOEs and the laser, and also by displacing the DOE toward the laser or toward the lens. The adjusting device for controlling the divergence angle of the laser beam is a set of lenses or a beam expander. The divergence angle of the beam can be raised by a lens having a long negative focal length. Otherwise, a lens having a positive focal length can decrease the divergence angle and can further make a converging beam. Since a beam expander includes at least two lenses, the alteration of the interval between the lenses changes the divergence angle of the output laser beam.

The purpose of this invention is to take advantages of the flexibility of the galvanomirrors and the high performance of the diffractive optical elements. However, a blunt combination of the galvanomirrors and the diffractive optical elements is useless, because the galvanomirror and the DOE require different kinds of converging lenses. As mentioned before, galvanomirrors are suitable to make a deflection device moving at a constant angular velocity. The fθ lens is preferable for the galvanomirror which aims at boring a plurality of holes at a constant interval. On the contrary, the DOE requires an f sin θ lens as a suitable converging lens. The most preferable lens is different for the galvanomirror and the DOE. Unfortunately, there is no lens which is appropriate to both the galvanomirror and the DOE.

Thus, this invention abandons the fθ lens but adopts the f sin θ lens for a common convergence lens. The diffractive optical element (DOE) has poor flexibility but the galvanomirror is endowed with easily controllable parameters. Thus, this invention chooses the f sin θ lens for the sake of the rigidity of the DOE. If the angular velocity of the swaying motion were constant, the fθ lens would be suitable for the galvanomirrors. It is possible to perturb the rate of angular velocity in a ratio of cos θ in the galvanomirror instead of the constant angular velocity. The modulation of the rate of con θ can be realized by mixing higher order harmonics with the fundamental sine wave. The f sin θ lens would enable the galvanomirror to perforate many microholes at a constant interval by accelerating the swaying motion near θ=0 and decelerating the swaying motion for bigger θs. When the amplitude of the swaying motion is small, a little addition of harmonics is enough for boring holes at the constant interval, since the difference between f sin θ and fθ is small.

When a definite location of the image plane should be aimed, the galvanomirror should sway in a larger amplitude than the fθ lens. The f sin θ lens needs a bigger swaying angle of $\alpha'=\sin^{-1}\alpha$ than fθ lens, a is defined as the swaying angle of the galvanomirror. It is, thus, possible to realize high precision scanning even with the f sin θ lens by controlling the swaying angle or the angular velocity of the galvanomirrors.

DOEs described hitherto mean the Fraunhofer type DOEs which have only the function of dividing a beam into a plurality of beams. This invention, however, can be applied to the Fresnel type DOEs which have finite focal lengths. The advantages of the Fresnel type DOE are annihilation of the 0th order light and high freedom of size-change of hole patterns.

This invention includes a laser, a DOE and an f sin θ lens. The DOE diffracts the laser beam into a plurality of beams with different slanting angles. The f sin θ lens makes spots with a definite interval on an image plane by converging the parallel beams into small spots. The DOE enables this invention to bore many holes simultaneously on printed circuit boards at a high speed. The f sin θ lens satisfies the required location accuracy of the diffraction spots and allows this invention to make use of high order diffraction beams. The use of high order diffraction beams raises the number of holes which can be bored at the same time.

Furthermore, this invention assembles the galvanomirror beam scanning system with the DOE diffraction system. According to the hole arrangement patterns, either the galvanomirror beam scanning system or the DOE diffraction system is chosen for boring multiholes on printed circuit boards. The high speed boring of the DOE system and the high flexibility of the galvanomirror scanning system realize an excellent hole boring apparatus by compensating the counterparts for the defects. If the DOE is positioned at the middle of two galvanomirrors, the telecentricity of the f sin θ lens exhibits the highest performance.

A rotatable disc having windows with a plurality of different DOEs enables the system to change various hole pattern processing in an instant by rotating the disc. The rotary disc is useful in the hybrid apparatus including the DOE boring system and the galvanomirror boring system. In the hybrid case of the Fraunhofer DOE and the galvanomirror, at least one window should be left to be an open window. The open window allows the galvanomirror system to scan the pulse laser beam on the object print board. In the hybrid case of the Fresnel DOE and the galvanomirror, at least one window should be installed with a lens having the same focal length as the Fresnel DOE. The lens-furnished window allows the galvanomirror system to scan the pulse laser beam on the object print board placed at the same height as the case of the Fresnel DOE. The rotary disc facilitates to exchange the DOE system reciprocally with the galvanomirror system.

The hole interval can be raised or reduced by adjusting the dispersion angle of the incident laser beam by, e.g., a beam expander or a lens and by displacing the DOE forward or backward. The DOE-displacing adjustment enables the system to change the hole interval. Another controlling of the hole spacing is based on the mask imaging optical systems. The size of the spot image is determined by the size of the pinhole. The hole interval can be increased or decreased by changing the position of the pinhole mask or by displacing the DOE.

This invention can make use of both the Fraunhofer type DOE having an infinitely long focus and the Fresnel type DOE having a finite focus. The change of the distance between the lens and the DOE enables the present invention to change the interval of the diffraction patterns. The use of the Fresnel DOE enlarges the scope of the size change of the patterns. The Fresnel DOE can eliminate the influence of the 0th order noise light.

DETAILED DESCRIPTION OF THE PREFERRED EMBODIMENTS

The design of an f sin θ lens is explained. A diffraction grating is placed as a DOE between a light source and the f sin θ lens for considering each order of the diffracted beams. Λ is the period of the grating. The light source emits monochromatic light of a wavelength λ. A beam going into the grating at an incidence angle $\theta_i$ is diffracted in the n-th order by the grating and goes out of the grating at a diffraction angle $\theta_n$. The difference of the path length between the inlet beams and the outlet beam should be equal to a distance of n times as long as λ. The relation between $\theta_n$ and $\theta_i$ is given by, $$\Lambda(\sin\theta_n - \sin\theta_i) = n\lambda. \tag{12}$$

In the case of the orthogonal incidence ($\theta_i=0$), in particular, the relation is reduced to a simple equation, $$\Lambda \sin\theta = n\lambda. \tag{13}$$

The design of the f sin θ lens now employs the method of a merit function. The design of a lens based upon the merit function is known to the skilled. A merit function is built by choosing several pertinent parameters, tracing optical rays in the assembly of lenses, determining the practical values of the parameters for the ray tracing, calculating the squares of errors between the object values and the practical values of the selected parameters and summing up the squares of the errors. A larger merit function means larger errors. A smaller merit function denotes smaller errors. The merit function method tries to seek a set of the most suitable variables by changing the values of the variables in the direction of reducing the merit function.

For example, ray aberration is employed for building the merit function for designing the lens. Another optical error, e.g., wavefront error, may be employed for producing the merit function instead of the ray aberration. A set of rays which would be converged to a spot in an ideal case arrive at different spots on an image plane in practice due to the errors. Thus, the merit function is constructed by summing the squares of the deviations (distances) of the spots that the rays reach from the predetermined spots. The deviation of the calculated spot of each ray from the predetermined ideal spot is the ray aberration. Since the current merit function is defined as a sum of the squares of ray spot errors, it is said that the ray aberration is employed as a merit function.

Figure 9:
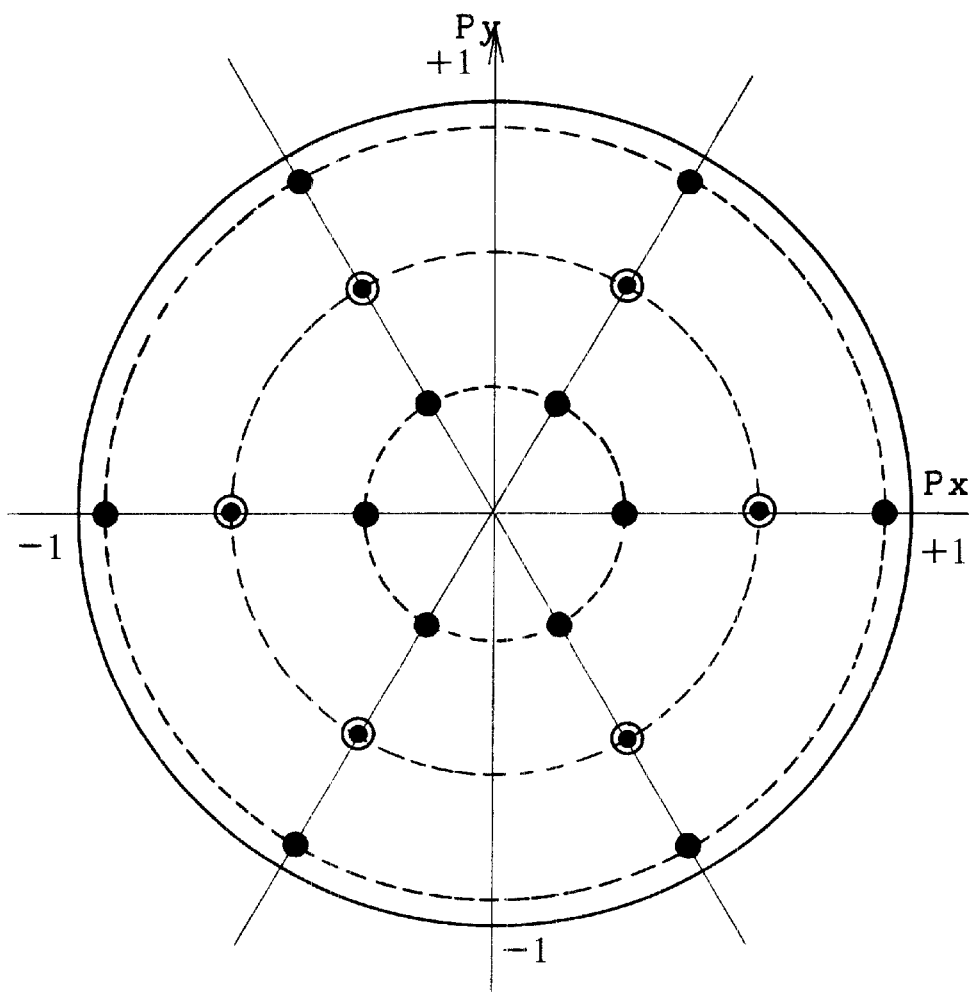
FIG. 9 is a front view of the entrance pupil for showing the ray distribution on the entrance pupil and the weights of the rays for the merit function to include a sum of the square errors of the ray deviations calculated by the ray tracing method.

FIG. 9 shows an example of the ray distribution on the entrance pupil. Here, the entrance pupil can be deemed as a section of rays going into the lens. One point on the entrance pupil signifies one ray. Arbitrary number of rays can be assumed on any points ($P_x$, $P_y$) of the entrance pupil. Here, ($P_x$, $P_y$) means a coordinate of a point taken on the entrance pupil. The size of the entrance pupil is normalized by denoting the region with a unit circle of a radius of 1. Enhancement of the accuracy of calculation requires to increase the number of sampling points on the entrance pupil and the sampling rays going through the sampling points. Reduction of calculation time and quick treatment, however, require to decrease the number of the sampling points and the sampling rays. Compromise of the accuracy with the processing time gives 18 sampling rays and 18 sampling points to the entrance pupil of FIG. 9.

The entrance pupil has six arms (half lines) extending radially from the origin and three concentric rings (circles) for determining the 18 sampling points. The slanting angles of the six arms (half lines) to the $P_x$-axis are 0 degree, 60 degrees, 120 degrees, 180 degrees, 240 degrees and 300 degrees. The radii of the three rings are R=0.3357, 0.7071 and 0.9420. The six arms and the three rings make 18 crossing points. The 18 crossing points are assumed to be the sampling points at which the sampling rays shoot the entrance pupil. The weights of 12 sampling rays corresponding to the 12 black dots belonging to the first and the third rings are $w_j$=0.048481. The weights of 6 sampling rays corresponding to the 6 white/black dots of the second ring are $w_j$=0.07757. The sum of weights is, of course, 1 ($\Sigma w_j$=1).

The sampling points on the entrance pupil determine initial positions of the sampling rays. An incidence angle of the rays is still an extra parameter which can be given arbitrarily. Assuming an array of lenses and an incidence angle for the 18 sampling rays enables us to trace the loci of the sampling rays among the lenses and the image plane. The ray tracing method allows us to calculate the destinations of the sampling rays on the image plane by geometric optics. A set of all the 18 parallel rays having a common incidence angle θ should converge at a point h=f sin θ on the image plane, since the object lens should be an f sin θ lens. The calculated destinations for the 18 sampling rays of the incidence angle θ are not a single point but are still 18 points which are close together. Then, the centroid of the 18 destination points on the image plane is calculated. The deviation of the destination from the centroid is denoted by Δx and Δy for all the sampling rays on the image plane.

The number of rays is denoted by "j" (j=1, 2, ..., 18). The deviation from the centroid of the j-th ray is signified by $\Delta x_j$, and $\Delta y_j$. The aforementioned weight is designated as $w_j$ for the j-th ray. The order of diffraction is denoted by "n" (n=0, 1, 2, 3). The deviation of the n-th order diffraction belonging to the j-th sampling point is ($\Delta x_{n\ j}$, $\Delta y_{n\ j}$). Thus, the merit function on the ray aberration is obtained.

$$E_A = \Sigma\Sigma w_n w_j (\Delta x_{nj}^2 + \Delta y_{nj}^2). \quad (14)$$

The lens parameters should be changed for minimizing the merit function. If there were no errors, that is, all deviations are $\Delta x_{n\ j}$=0 and $\Delta y_{n\ j}$=0, the merit function would be zero. A smaller merit function gives more suitable lens parameters.

The above merit function enables the lens designers to estimate the convergence property of a temporary set of lenses. The merit function is not sufficient, since the convergence property is not the sole requirement. In addition to the convergence property, the f sin θ lens has another important requisites, that is, distortion property and telecentricity. The merit function should allow us to estimate the distortion property and the telecentricity on the image of the lens. The merit function taking account of the distortion property and the telecentricity can optimize the lens parameters for improving the position accuracy of focal points and the orthogonality of convergence for each diffraction order.

Figure 10:
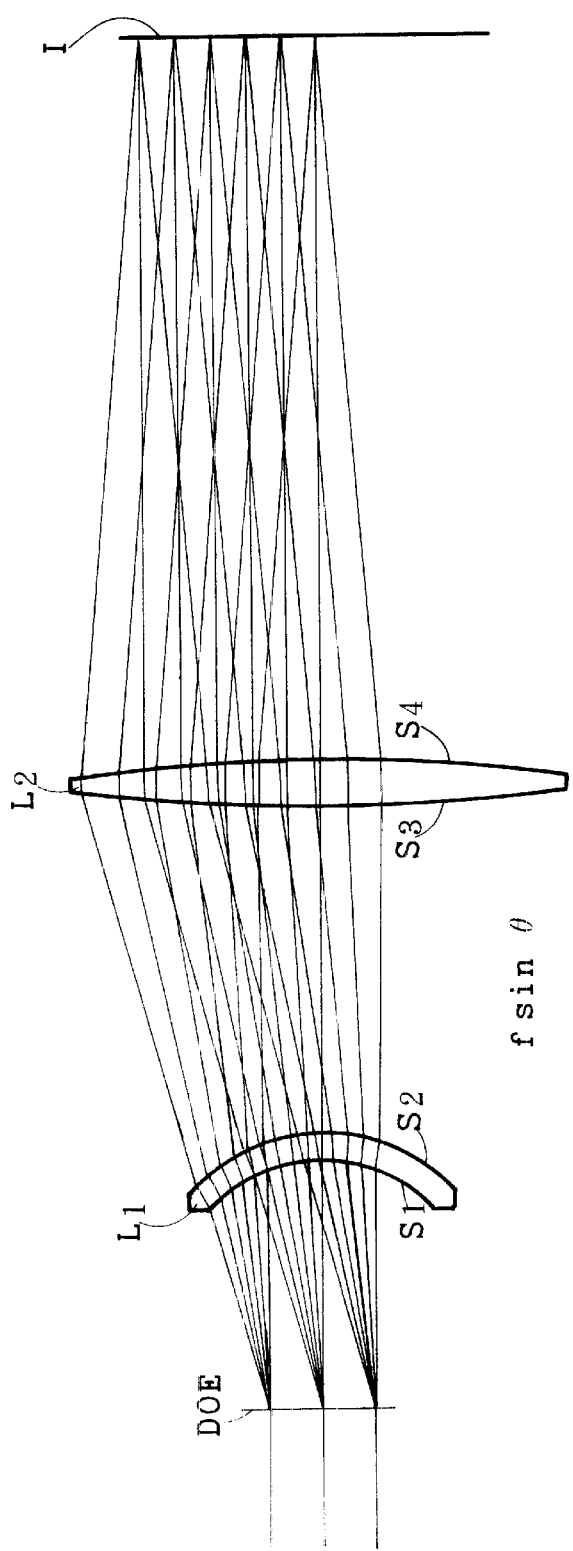
FIG. 10 is a beam diagram of a DOE-f sin θ lens-image plane system for showing the beams diffracted by the DOE, converged by the f sin θ lens and projected on the image plane and the spots made on the image plane by the beams. The 0th order diffracted beams, the 1st order diffracted beams, the 2nd order diffracted beams, the 3rd order diffracted beams, the 4th order diffracted beams and the 5th order diffracted beams are shown.
Figure 11:
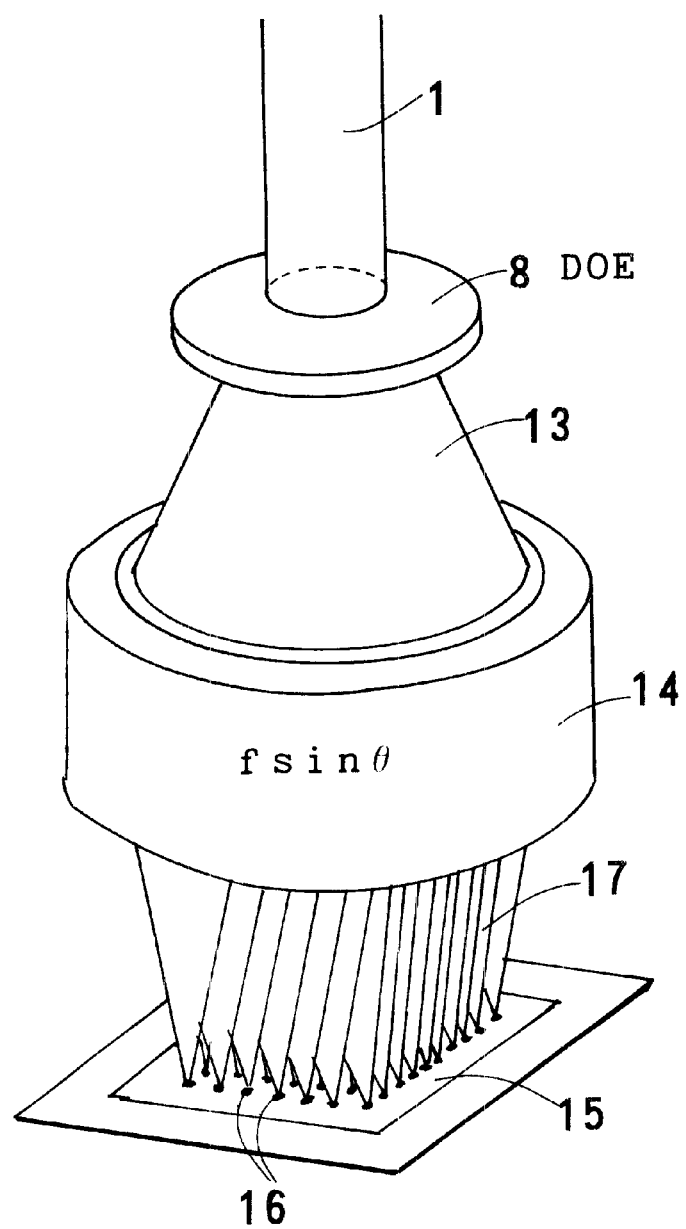
FIG. 11 is a perspective view of a DOE type laser boring apparatus of the present invention which diffracts a laser beam by a DOE into many beams, refracts the beams by an f sin θ lens and makes spots on an object for boring many holes on e.g., packages.

An additional merit function is now considered for the estimation of the f sin θ property. FIG. 10 shows the diffraction in the system having a DOE, an f sin θ lens consisting of two lenses L1 and L2 and an image plane I. The DOE has a spatial period Λ and produces the 0th order, the 1st order, the 2nd order, the 3rd order, the 4th order and the 5th order diffraction beams. The six diffraction beams take different focal points $h_n$ (n=0, 1, 2, 3, 4 and 5) on the image plane. The ray tracing calculation determines the positions of the focal points $h_n$. Typical three rays are shown for all the six diffraction orders. Thus, loci of typical 18 rays are denoted in FIG. 10. A set of three rays having a common diffraction angle at the DOE converge at a common spot.

The ideal focal point $g_n$ of the n-th order diffraction on the image plane is given by, $$g_n = n\lambda f/\Lambda. \quad (15)$$

where f is the focal length of the lens, Λ is the spatial period of the DOE and λ is the wavelength of the light. The object is assumed to be at an infinitely distant point in front of the lens. An additional merit function can be defined by, $$E_D = \Sigma(g_n - h_n)^2. \quad (16)$$

A more bigger period Λ and a higher diffraction order n than 5 can give more detailed estimation of the f sin θ property.

The incidence angle $\Theta_n$ on the image plane of the chief ray of each diffraction order is calculated by tracing the chief ray on geometric optics for estimating the telecentricity. The telecentricity requires $\Theta_n$ to be close to 0. Ideal values are $\Theta_n$=0. Thus, $\Theta_n$ is an error itself for the telecentricity. The telecentricity can be taken into consideration by an additional merit function, $$E_T = \Sigma\Theta_n^2. \quad (17)$$

Suitable sets of lens parameters are obtained by minimizing the merit functions of Eq.(14), Eq.(16) and Eq.(17). The above is a general premise of the merit function. Predetermination of the focal length and the desired lens thickness enables the merit function to take a more concrete form.

For example, when the preferable focal length f is determined to be 127 mm, an additional merit function $e_1$ should be given by, $$e_1 = (f - 127)^2. \quad (18)$$

The focal length would be led to a value very close to 127 mm by adding $e_1$ into the merit function. Unlike the focal length, it is difficult to give an exact object value to the lens thickness. Then, a definite scope should be given to the lens thickness instead of a single value. For example, if the desirable lens thickness t should range from 3.5 mm to 15 mm, an additional merit function $e_2$ may be $$e_2 = \alpha(t - 3.5)^2 + \beta(t - 15)^2. \quad (19)$$

α is a binary parameter which is determined α=0 for t>3.5 mm but α=1 for t≦3.5 mm. β is another binary parameter which is determined to be β=1 for t≧15 mm but β=0 for t<15 mm. When t ranges from 3.5 mm to 15 mm, $e_2$ is zero. $e_2$ out of the range has positive values. The merit function $e_2$ has a role of pulling t into the range between 3.5 mm and 15 mm.

A restriction merit function $E_c$ is made by summing up the restricting merit functions $e_c$ ($e_1$, $e_2$, ...) with pertinent weights.

$$E_C = \Sigma w_c e_c. \quad (20)$$

A total merit function E is produced by summing the partial merit functions of Eq.(14), Eq.(16), Eq.(17) and Eq.(20) with weights $W_A$, $W_D$, $W_T$ and $W_C$.

$$E = W_A E_A + W_D E_D + W_T E_T + W_C E_C. \quad (21)$$

In general, the weights $W_A$, $W_D$, $W_T$ and $W_C$ should be determined for balancing the partial merit functions $E_A$, $E_D$, $E_T$ and $E_C$. Here simply, assuming that $W_A = W_D = W_{T=WC} = 1$, E is reduced to, $$E = E_A + E_D + E_T + E_C. \quad (22)$$

Optimum sets of solutions are obtained by minimizing the total merit function. Estimation of the optimum sets of solutions brings about the most suitable set of parameters for the ray aberrations, the f sin θ property, the telecentricity and other confinement restrictions.

[The Case Deviating from the Telecentricity; Non-telecentric Case]

Figure 1:
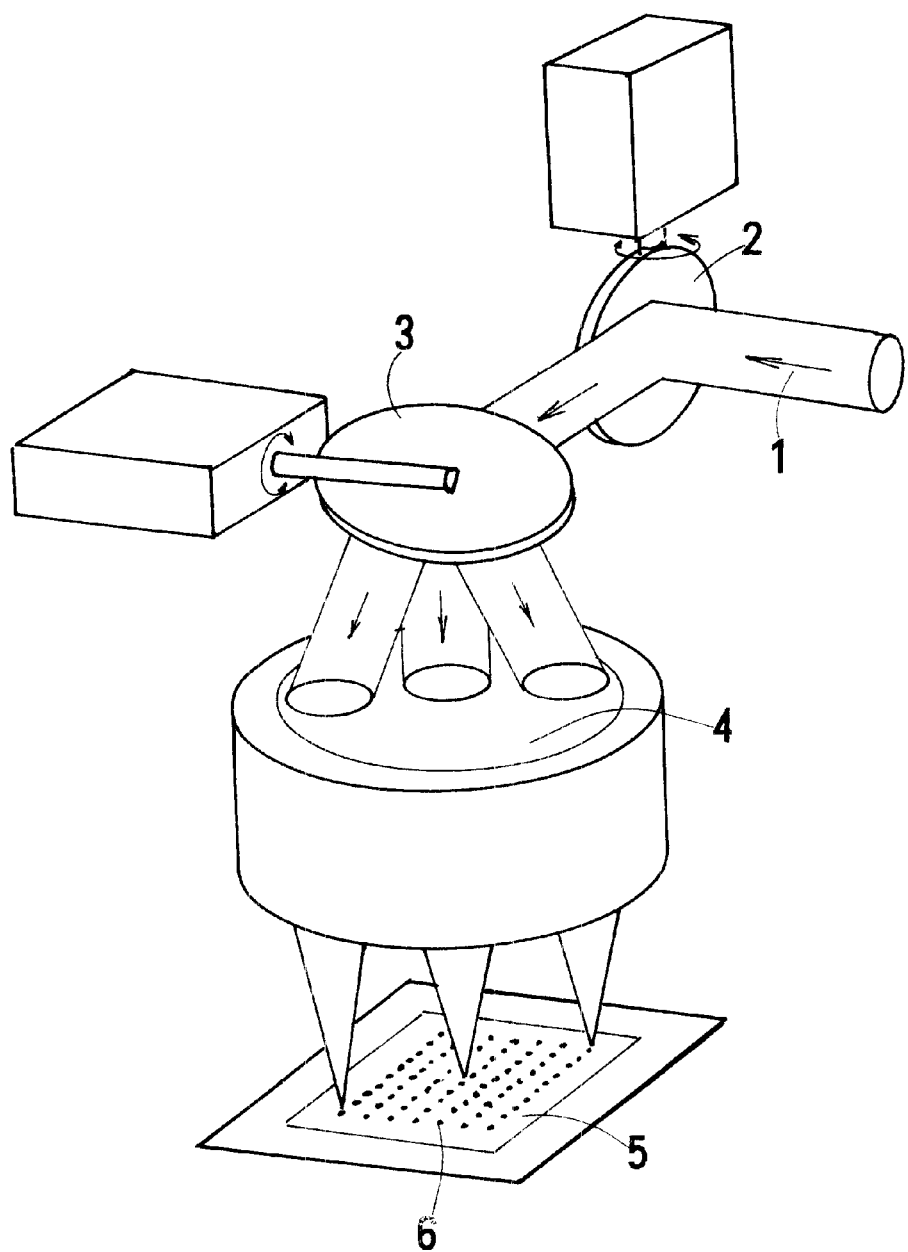
FIG. 1 is a perspective view of a galvanomirror type laser boring apparatus.
Figure 2:
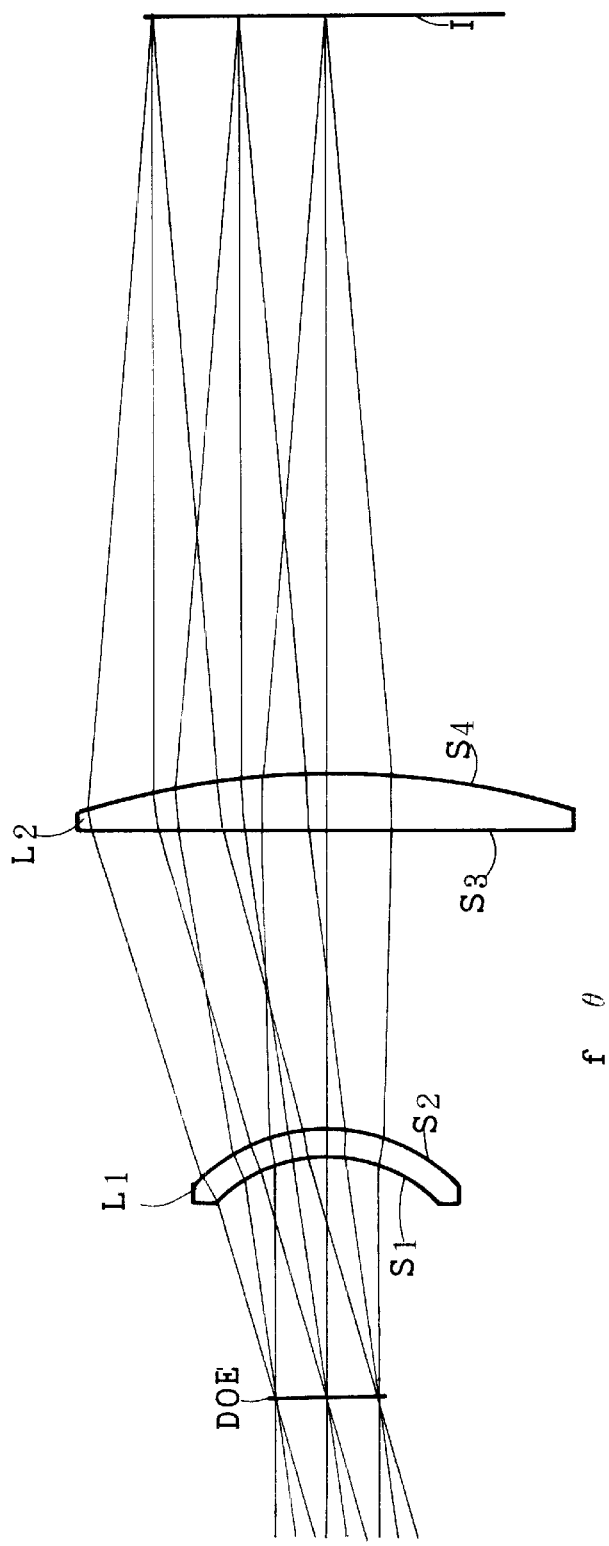
FIG. 2 is a ray tracing diagram showing the 0th order diffraction beams, the 1st order diffraction beams and the 2nd order diffraction beams for converging the DOE passing beams by an fθ lens which is designed for the galvanomirror type apparatus.
Figure 3:
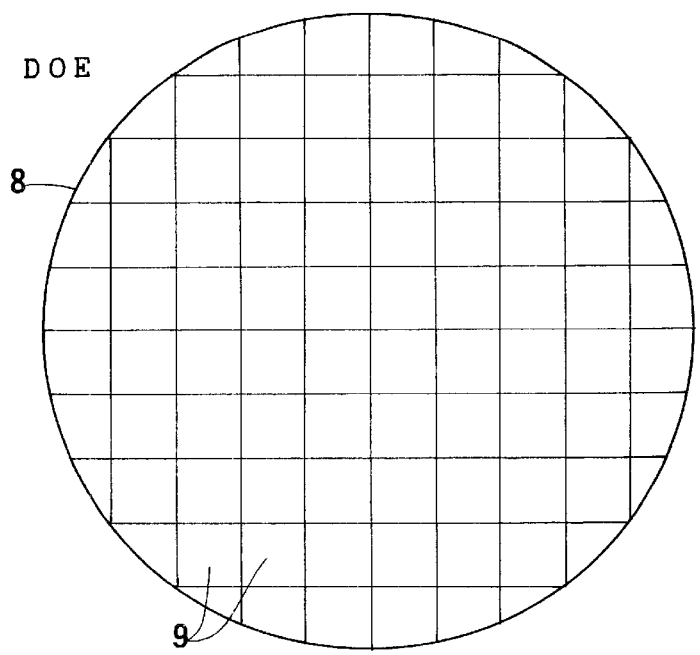
FIG. 3 is a schematic plan view of a DOE (diffractive optical element).
Figure 4:
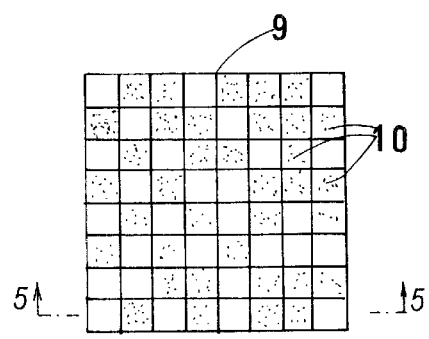
FIG. 4 is a plan view of a unit pattern of a DOE.
Figure 5:
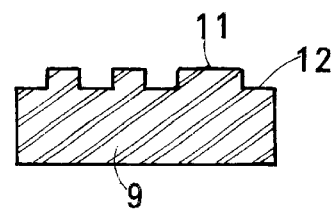
FIG. 5 is a section taken along L—L line in FIG. 4.
Figure 6:
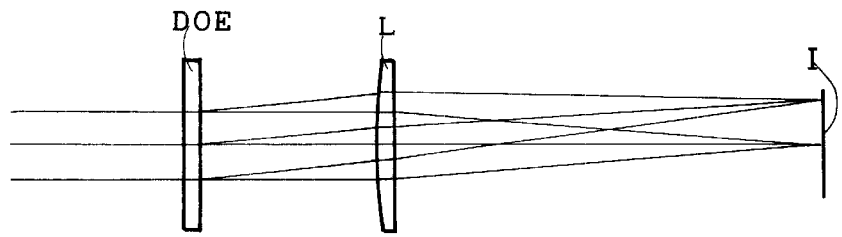
FIG. 6 is a beam diagram of a DOE-lens-image plane system of converging the beams diffracted by the DOE by the lens at spots on the image plane.

The telecentricity is important for the f sin θ lens which is used for boring vertical microholes. The consideration of the deviation from the telecentricity is also important for two reasons of estimating the quality of the bored holes and of the probability of size-change of hole patterns, i.e., enlargement or shrinkage. A DOE, an f sin θ lens and an image plane I are arranged on the optical axis, as shown in FIG. 6. When the DOE is positioned at the front focus of the lens, all chief rays divided by the DOE into different angles are collimated into parallel rays by the f sin θ lens and are brought to the image plane at right angles. When the chief rays collimated by the lens shoot vertically the image plane, it is said that the lens has the "telecentricity". Here, the word "beam" means a light assembly at any order of diffraction divided by the DOE. Namely, the DOE produces the 0-th order beam, the 1st order beam, the 2nd order beam or so. A beam is an assembly of rays which belongs to the same order diffraction. The n-th order diffraction beam is a single beam but the n-th order diffraction beam has many rays. The beam is a collective concept and the ray is an individual concept. The original laser light becomes a plurality of beams separated into different order by the DOE. The laser light becomes a bundle of beams and one beam is a bundle of rays. Telecentricity is defined for a beam which has a chief ray orthogonal to the image plane. The distance from the lens to the front focus is "f". The distance from the lens to the back focus is also "f". The distance between the lens and the image plane is denoted by "b". The laser light is deemed to be light from a point light source which is placed at a far distant point. The distance between the point light source and the lens is designated by "a". When the DOE is positioned at the front focus, the converged beams are "telecentric", i.e., the chief ray included in the beams are vertical to the image plane.

Figure 7:
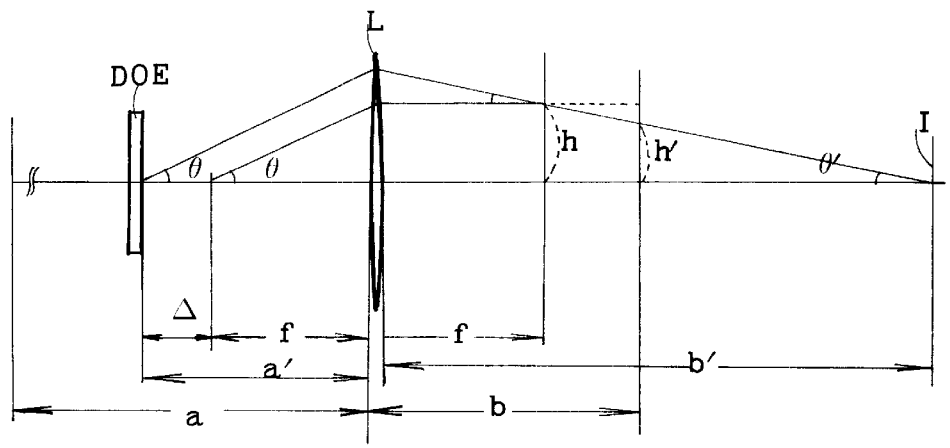
FIG. 7 is a beam diagram of a DOE-lens-image plane system for showing the change of the interval of the diffracted beams induced by the backward displacement of the DOE from the tens front focus.

When the DOE displaces backward or forward by $\Delta(\pm)$ from the front focus, the beams lose the telecentricity. This case is briefly called "non-telecentric". The change of the size of the diffraction image induced by $\Delta$ is now estimated. FIG. 7 shows the DOE deviating backward by $\Delta$ from the front focus of the lens.

The distance between the DOE and the lens is denoted by "a'''"(=f+Δ). A chief ray diffracted by the DOE at an angle θ is refracted by the lens and crosses the optical axis at a point which is distanced from the lens by "b'''". The plane I is placed at the same point distanced from the lens by b'. The shooting angle of the ray to the plane I is θ'. The same ray crosses the back focus plane at a height of h. Another ray emitted at an angle θ from a DOE at the forward focus crosses the rear focal plane of f at the same height h. Namely, h is the original image height emitted at angle θ from the DOE at the front focus.

$$\tan \theta' = h/(b'-f) \tag{23}$$

Since an object at (Δ+f) before the lens makes an image at b' behind the lens by the lens of a focal length of f, the relation between Δ and b' is determined by the well-known lens formula, $$(\Delta+f)^{-1} + b'^{-1} = f^{-1}. \tag{24}$$

$$\Delta(b'-f) = f^2 \tag{25}$$

From Eq.(25) and Eq.(23), $$\tan \theta' = \Delta h/f^2. \tag{26}$$

The system of FIG. 7 is not telecentric, because the DOE deviates from the front focus. The image height h' on the image plane positioned at b behind the lens deviates from the height h in the telecentric case. The telecentric case means that the DOE lies at f before the lens. In the telecentric case, all the chief rays are parallel to the optical axis, the height is always "h" despite the position of the image plane. (h–h') is the difference of the heights between the telecentric case and the non-telecentric case. The θ slanting ray from the DOE at (Δ+f) and the θ slanting ray from the DOE at f cross the back focal plane at the same point of the height h. A positive lens converges parallel incident rays at a point on a back focal plane in general. Since the image plane deviates by (b–f) from the back focal plane, h is reduced to h' by the slanting ray at angle θ'.

$$h' = h - (b-f) \tan \theta'. \tag{27}$$

Substitution of Eq.(26) into Eq.(27) makes, $$h' = h\{1 - (b-f)\Delta/f^2\}. \tag{28}$$

Eq.(28) means that backward displacement of the DOE from the front focus (f) to a point of (f+Δ) decreases the size of the image from h (Δ=0) to h'(Δ>0). On the contrary, the image size h' increases by forward displacement (Δ<0) of the DOE toward the lens.

The above consideration is derived from taking account of only the chief ray emitted from the center of the DOE. The same result would be obtained with regard to all the other rays which emanate from any points of the DOE at the same angle θ. All the rays emanating from the DOE at the front focus (Δ=0) converge at the height h on the image plane at b. All the rays emanating from the DOE at a point (f+Δ) deviating from the front focus converge at the height h' on the image plane at b. $\theta_j$ is the slanting angle of the j-th order diffraction at the DOE. $\theta_{j+1}$ is the slanting angle of the (j+1)-th order diffraction at the DOE. The distance between the j-th order diffraction spot and the (j+1)-th order diffraction spot on the image plane is denoted by $d_j$, when the DOE lies just at the front focus. The distance between the j-th order diffraction spot and the (j+1)-th order diffraction spot on the image plane is denoted by $d_j'$, when the DOE lies at a spot deviating by Δ from the front focus. The same relation rules the $d_j$ and $d_j'$.

$$d_j' = d_j\{1 - (b-f)\Delta/f^2\}. \tag{29}$$

The spacing $d_j$ would be a pitch of holes bored on the board. Eq.(29) means that the pitch of holes can be reduced by displacing the DOE toward the laser and can be increased by displacing the DOE toward the lens.

The divergence of a laser beam, in general, is not so large, because the laser beam can be thought to be a bundle of quasi-parallel rays. The small divergence of the laser beam means a far long distance "a". The long "a" means that "b" is nearly equal to "f". Then (b–f) in the right hand of Eq.(29) is near to 0. The small (b–f) means that a change of Δ induces little change of $d_j'$. In order to widen the scope of the pattern size adjustment, enlargement of the laser beam divergence is indispensable. An enlarged divergence of a laser beam can realize high freedom of adjusting the pitch or the spatial period $d_j'$ of holes by reducing "a" and raising (b–f).

A simple means for changing the divergence of a laser beam is a lens. A negative lens (concave lens) having a negative focal length can increase the divergence angle of the laser beam. On the contrary, the use of positive lens decreases the divergence angle of the beam and furthermore converges the beam at the focal point.

Figure 13:
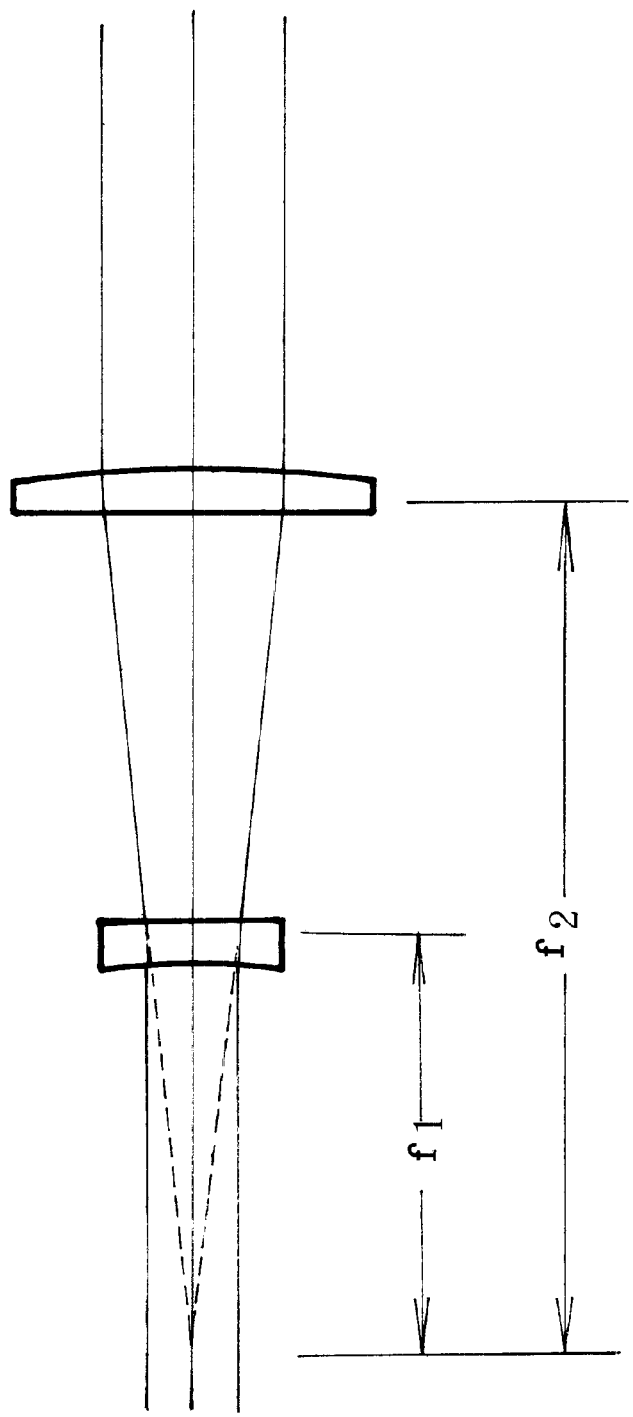
FIG. 13 is a schematic view of a beam expander having a negative focus lens and a positive focus lens for converting a parallel beam into another parallel beam of a different diameter. The front focus of the negative focus lens coincides with the front focus of the positive focus lens.

Another means for changing the divergence of the laser beam is a beam expander. A Galilei type beam expander consists of a negative lens and a positive lens. A negative lens is a lens having a negative focal length and has the power of diverging light. A positive lens is a lens having a positive focal length and has the power of converging light. FIG. 13 shows an example of a Galilean type beam expander. The negative lens has a negative focal length of $-f_1$. The positive lens has a positive focal length of $+f_2$. The lens spacing is $d=(f_2-f_1)$. The first negative lens converges the parallel beam into a virtual focal point at $f_1$ in front of the lens. The second positive lens converts the beam from the virtual point at $f_2$ in front of the lens into a parallel beam. The ratio $f_2/f_1$ determines the diameter of the output beam. When a parallel beam (an assembly of parallel rays) goes in the first lens, another parallel beam having a diameter enlarged by the rate of $f_2/f_1$ goes out of the second lens.

Figure 14:
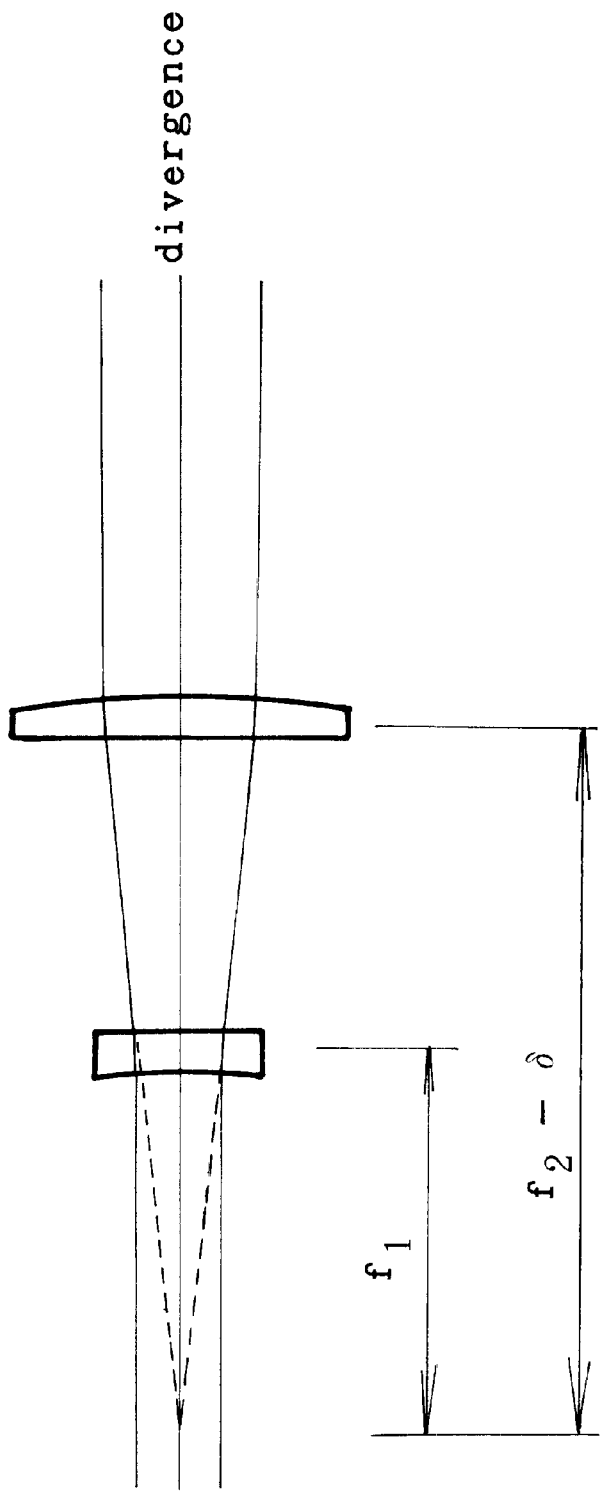
FIG. 14 is a schematic view of a beam expander having a negative focus lens and a positive focus lens for converting a parallel beam into a diverging beam. The front focus of the negative focus lens deviates forward from the front focus of the positive focus lens.
Figure 15:
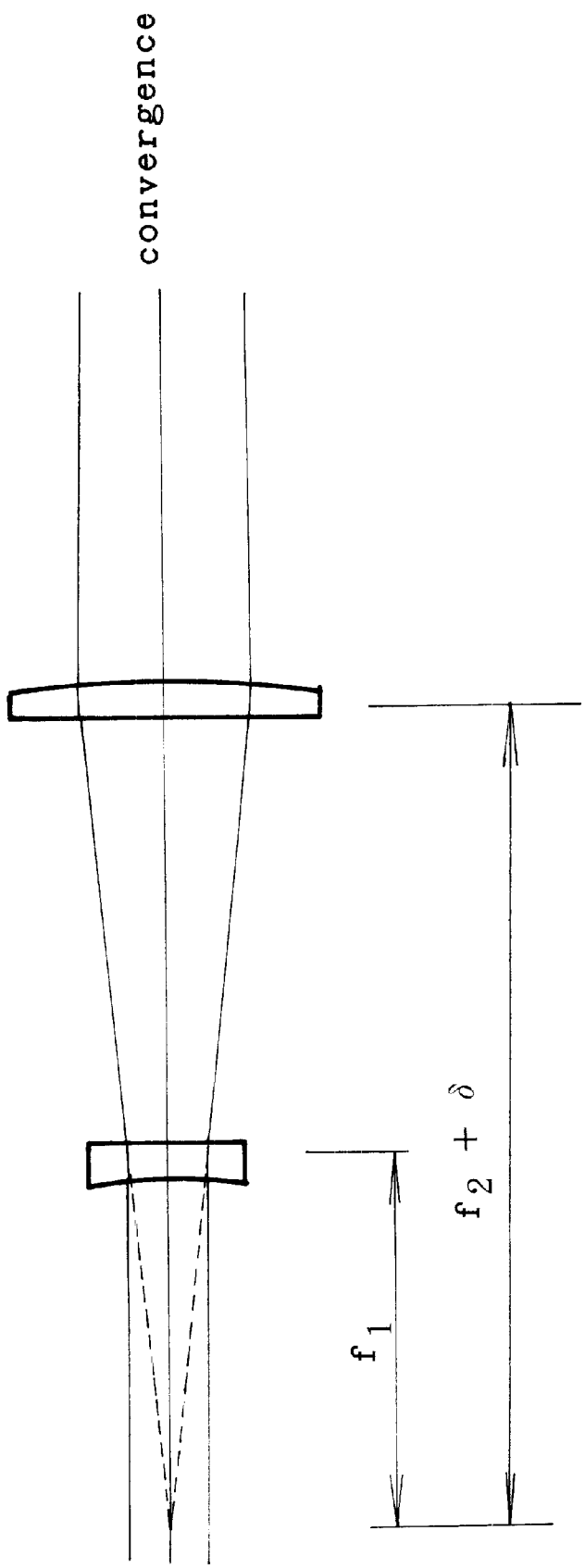
FIG. 15 is a schematic view of a beam expander having a negative focus lens and a positive focus lens for converting a parallel beam into a converging beam. The front focus of the negative focus lens deviates backward from the front focus of the positive focus lens.

If the spacing d is changed to be less than $(f_2-f_1)$ ($d<(f_2-f_1)$), the outgoing beam is a divergent beam (FIG. 14). If the spacing d is changed to be more than $(f_2-f_1)$ ($d>(f_2-f_1)$), the outgoing beam is a convergent beam (FIG. 15). The change of the spacing enables the beam expander to vary the divergence angle of a laser beam. The radius of the incident beam is denoted by "R". The increment of the distance between the lenses is denoted by $\delta=d-(f_2-f_1)$. Half divergence angle $\Theta$ of the output beam is given by $$\tan \Theta = R\delta/f_1 f_2. \tag{30}$$

For example, when R=5 mm, $f_1$=50 mm, $f_2$=100 mm and d=50 mm, the system is a beam expander of a magnification of two ($f_2/f_1$=2). The half divergence angle is calculated to $$\tan \Theta = 0.001 \times \delta. \tag{31}$$

Controlling $\delta$ in a range of ±10 mm enables the expander to change the beam divergence angle in a scope of ±10 mrad ($10^{-3}$ rad; 1 mrad=0.056°). When the distance between the outlet of the expander and the lens is 100 mm, the parameter "a" would be either less than −1000 mm or more than +1000 mm ($|a|>1000$ mm). If the focal length of the lens is f=100 mm, (b−f) ranges from −9.1 mm to +11.1 mm. Controlling $\Delta$ in a range of ±10 mm can change the spacing of spots about ±1%. The telecentricity is still satisfactory, since $|\tan \theta'|<0.025$, namely $\theta'$ is less than ±1.4 degrees from Eq.(26) for h<25 mm. The method of size-change of patterns is based upon the deviation of the DOE from the front focus.

Figure 16:
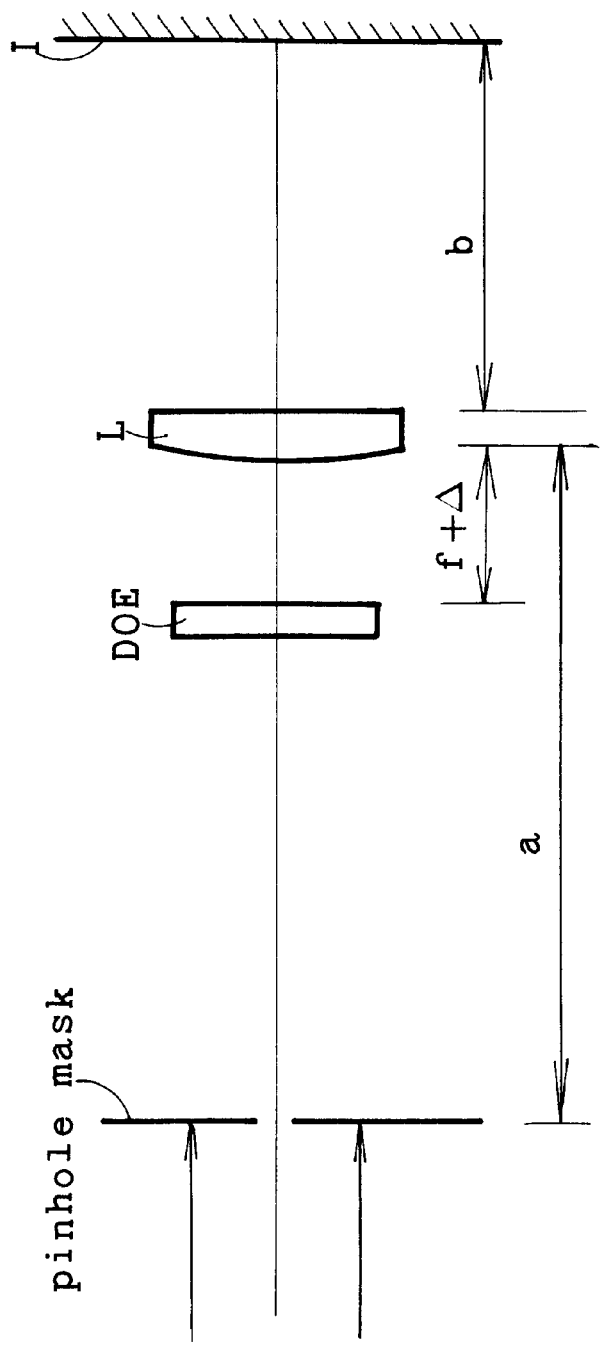
FIG. 16 is a schematic view of mask imaging optical system.

Another method of size-change of patterns is based upon "mask imaging optics". FIG. 16 shows a fundamental structure of the mask imaging optics. A pinhole mask precedes the DOE and the lens. The parallel laser light passes the pinhole of the mask. The lens makes an image of the pinhole on the image plane I. The object-lens distance "a" is identified to the distance between the mask and the lens L. The lens-image distance is denoted by "b" in FIG. 16. The magnification M of the mask imaging optics is M=b/a. The spot formed on the image plane has a diameter M times as large as the pinhole diameter. Namely the diameter of the spot on the image plane is determined by the diameter of the pinhole of the mask.

When the DOE is placed at the front focus of the lens, diffracted beams are converged by the lens and burn out small holes of the predetermined size in a print board. The magnification M is equal to M=b/a=f/(a−f)=(b−f)/f The interval $d_j$ of Eq.(29) between spots on the image plane (print board) $d_j$ is, $$d_j' = d_j(1 - M\Delta/f). \tag{32}$$

For example, assuming that a=1100 mm and f=100 mm, the magnification is M=f/(a−f)=0.1. Selecting a pinhole mask of a 1 mm φ hole allows the system to bore tiny holes of 0.1 mm φ son a board, when the DOE lies just at the front focus ($\Delta$=0). The spot interval $d_j$ can be changed in a range of ±1% by varying the deviation $\Delta$ in a scope of ±10 mm. Otherwise, for a constant $\Delta$=10 mm, the spot interval $d_j$ can also be controlled in a range of ±1% by changing "a" in a range between 1000 mm and 1200 mm, since M varies from 0.11 to 0.09. Then the hole diameter is changed about ±1% together with the interval. If the diameter should be maintained, the diameter of the pinhole should be changed for compensating the change of the hole diameter.

DOE can be endowed with various functions in general. The DOEs described hitherto are all the DOEs which bluntly divide an incidence beam into many separated beams. The DOE only divides the beam into many beams. When the incident beam is a parallel beam, diffracted beams are all parallel beams. When the incidence beam is a diverging beam, the separated beams are all diverging beams with the same divergence angle. The abovementioned DOE has no function of producing an image. Then, the DOE requires a lens for making an image on a plane. In the previous device, the DOE has a function of dividing a beam and the lens has a function of making an image. The diffraction property (intensity distribution on the image) can be described by the Fraunhofer diffraction theory. In the Fraunhofer diffraction, the phase distribution on the DOE is related to the amplitude distribution on the image by the Fourier transform. Then, the DOEs are called Fourier transform type DOEs or Fraunhofer type DOEs.

However, the Fraunhofer type DOE which has only the function of dividing a beam into many diffracted beam has two drawbacks. The weak points are explained here.

One drawback is the "0th order light" which is not separated by the DOE and goes in the same direction as the incident beam. The 0th order light is called the 0th-order diffraction beam. Even if the efficiency of the 0th order light is deemed to be no problem in the design, the production errors accompanying produced DOEs is likely to enlarge the influence of the 0th order diffraction. One dimensional diffraction which arranges the diffracted beam spots at a constant interval along a direct line on an image plane is considered for the sake of simplicity.

An odd number case of aligning an odd number of beams symmetrically from the origin of the image plane is first considered. The DOE produces the 0th order diffraction spot, the ±1st order diffraction spots, the ±2nd order diffraction spots, the ±3rd order diffraction spots, ... on the image plane. Some design enables the DOE to give the exactly equal intensity to all the diffraction orders of the light. Various production errors (the depth error of the steps, the width error of the steps or so) have a tendency of raising or reducing the 0th order light, in particular. The purpose of the laser hole boring is to perforate many holes of a definite equal size by burning the object point with equal energy. The fluctuation of the beam intensity incurs a serious problem.

In the case of an even number of divided beams, there is, inherently no beam spot at the on-axis center position on the image plane. The ±1st diffraction beams, the ±3rd diffraction beams, the ±5th diffraction beams, ... throw light spots at points of ±1, ±3, ±5, ... with two unit intervals on the image plane. Ideally, there is no 0th order spot on the plane. But in practice, the 0th order light makes an extra spot at the center of the image plane due to the production errors. The 0th order spot is an obstacle for boring an even number of holes on an object board.

In the case of an even number of beams, the production errors may induce the 0th order light to bore an extra, unnecessary hole at the on-axis origin on the printed circuit board. Sometimes the extra hole causes no problem. Such a case allows the use of the Fraunhofer type (Fourier transform type) DOE described hitherto. The Fraunhofer type DOE means the conventional DOE which makes diffraction beams with an infinitely long focal length. In the case of an odd number of diffraction beams, the production errors invite the fluctuation of the 0th order light. The fluctuation of the intensity would enlarge or reduce the hole burnt by the 0th order beam. Some case may forgive the extra large or small diameter of the 0th order hole. Such a case allows the use of the traditional Fraunhofer type DOE. However, another case may require rigorously equal diameter for each hole. The Fraunhofer type (Fourier transform type) DOE is not sufficient yet.

Another drawback of the Fraunhofer type DOE is poor freedom of size-change, i.e., enlargement or shrinkage of the patterns, as mentioned by referring to FIG. 7. The displacement of the DOE forward or backward enables the Fraunhofer type DOE to enlarge or reduce the patterns on the image plane. The scope of the size-change, however, is restricted within a narrow margin of ±1%. As shown in Eq.(29), the reason is that (b−f) cannot be so large. Another reason is that M is small in Eq.(32). The adjustment of the beam expander can enlarge (b−f). The displacement of the mask can enlarge M of Eq.(32). The requirements of the actual optical device restrict both (b−f) and M within a narrow scope. Too large displacement (Δ) of the DOE kills the telecentricity. The Fraunhofer DOE has not enough margin for the size-change of images.

The use of a Fresnel type DOE instead of the Fraunhofer type DOE is profitable for solving the problem of the 0th order light and for raising the freedom of size-change.

This invention employs the Fresnel type DOE in addition to the Fraunhofer type DOE. Then, the Fresnel type DOE is now explained. The Fresnel type DOE can be identified as a sum of a Fraunhofer DOE and a lens. In fact, there is no lens. The function of a lens, however, is assembled into the Fresnel DOE. Since the Fresnel DOE includes the function of a lens, the Fresnel DOE produces a set of diffraction beams having a finite focal length (f). The finite focal length is the feature of the Fresnel DOE.

Figure 18:
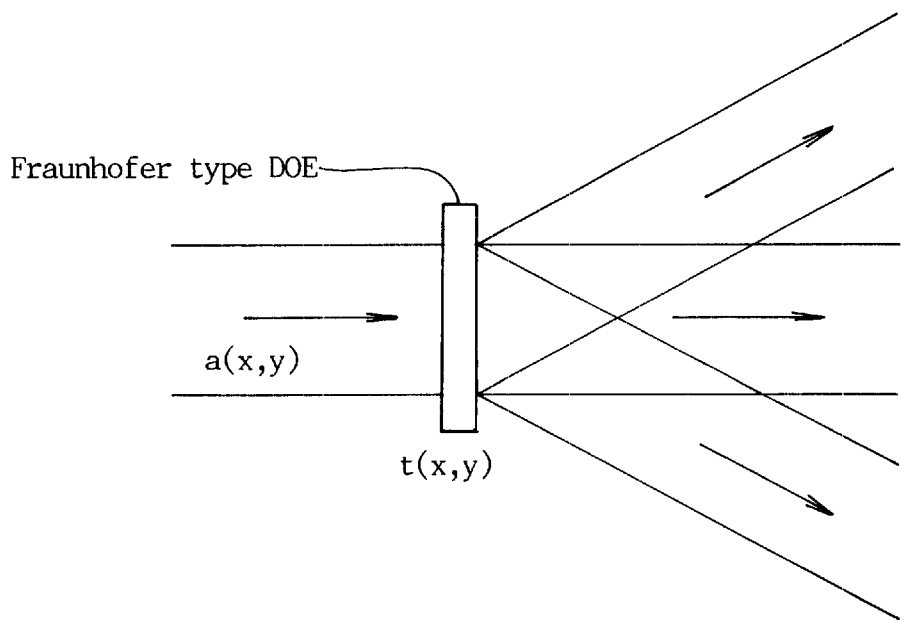
FIG. 18 is a beam diagram induced by a Fraunhofer DOE which divides a beam into a plurality of beams by diffraction.

FIG. 18 shows the diffraction of a usual Fraunhofer type DOE. All diffraction order beams are sets of parallel rays; because the incidence beam is a parallel beam. The FIG. depicts only three sets of diffraction beams for simplicity, but the DOE actually makes many diffraction beams consisting of parallel rays. The important matter is that all the rays belonging to the same order are parallel with each other.

Figure 19:
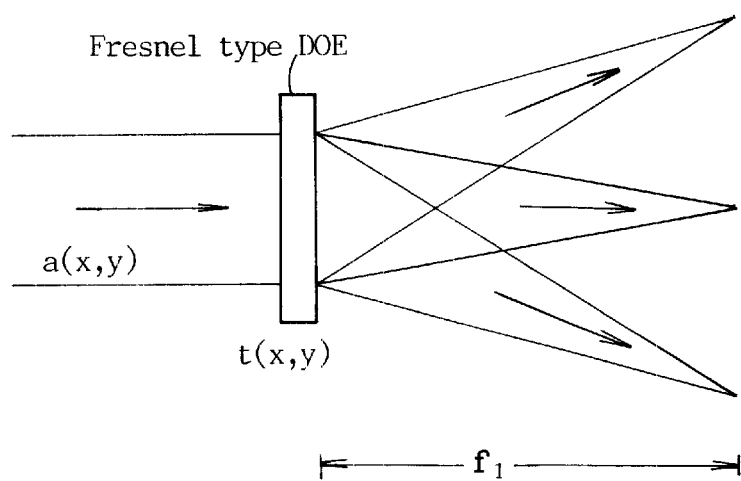
FIG. 19 is a beam diagram induced by a Fresnel DOE which produces converging or diverging diffraction beams with a finite focal length.

FIG. 19 shows the diffraction of a Fresnel type DOE. Both converging (positive power) and diverging (negative power) DOEs are available for the Fresnel type. FIG. 19 shows a converging Fresnel DOE. The converging points of all the diffracted beams ideally lie on a common plane (focal plane) orthogonal to the optical axis. The cross point of the plane with the optical axis is defined as a focus of the DOE.

It may sound strange that the DOE has a focus like a lens or a mirror. The converging point by the DOE can be called a focus since all order diffraction beams are equally converged on the plane. Although the origin of the convergence is diffraction indeed, it may be simply said that the DOE has positive refractive power like a lens. In addition to the positive refractive power, another DOE can be provided with negative refractive power.

Since the Fraunhofer diffraction is thought to be inherently a phenomenon which makes parallel beams of different angles with an infinitely long focus like planer diffraction gratings, it is rather difficult to imagine diffraction optical elements of a finite focal length. The finite focal length DOE will be explained later in more detail. First, the reason why the problems can be solved by the finite focal length DOE is explained.

Since the DOE itself has a finite focal length (positive or negative) $f_1$, all the split beams consist of the 0th order diffraction beam, the ±1st diffraction beams, the ±2nd order diffraction beams, . . . , the ±n-th order diffraction beams converge discretely on a (focal) plane distanced from the DOE by $f_1$. If a screen is placed at the point distanced by $f_1$ from the DOE, the 0th order diffraction beam, the ±1st diffraction beams, the ±2nd order diffraction beams, . . . , the ±n-th order diffraction beams form the 0th, the ±1st, the ±2nd, the ±3rd, . . . , the ±n-th spots on the screen. The spots distribute on the screen with a constant interval Any order diffraction beam has the same distance between the DOE and the convergence point, which is equal to the focal length. However, the 0th order light which is not diffracted by the DOE (which should not confused with the 0th-order split diffraction beam) is still parallel light which has an infinitely long focal length like the parallel incident beam. The obstacle 0th order light does neither converge on the screen nor make a spot on the screen. When the laser-DOE system is used for boring holes on printed boards, the 0th order light does not have the energy or power density for boring a hole on the object board. This is the crucial difference between the Fresnel DOE and the Fraunhofer DOE. The problem of the 0th order light is solved by employing the finite focal length DOE (Fresnel DOE). Such a solution is obtained both in the sole DOE system and in the DOE+lens system. The 0th order light causes no difficulty.

The Fresnel type DOE has another excellent feature of enhancing the freedom of the size-change of hole (spot) patterns. A sole DOE has no function of size-change of patterns. A couple with a lens enables the Fresnel DOE to change the size of patterns, i.e., enlargement or shrinkage. The principle of the size-change is now explained. The focal length of the Fresnel DOE is denoted by $f_1$ and the focal length of the lens is denoted by $f_2$.

Figure 20:
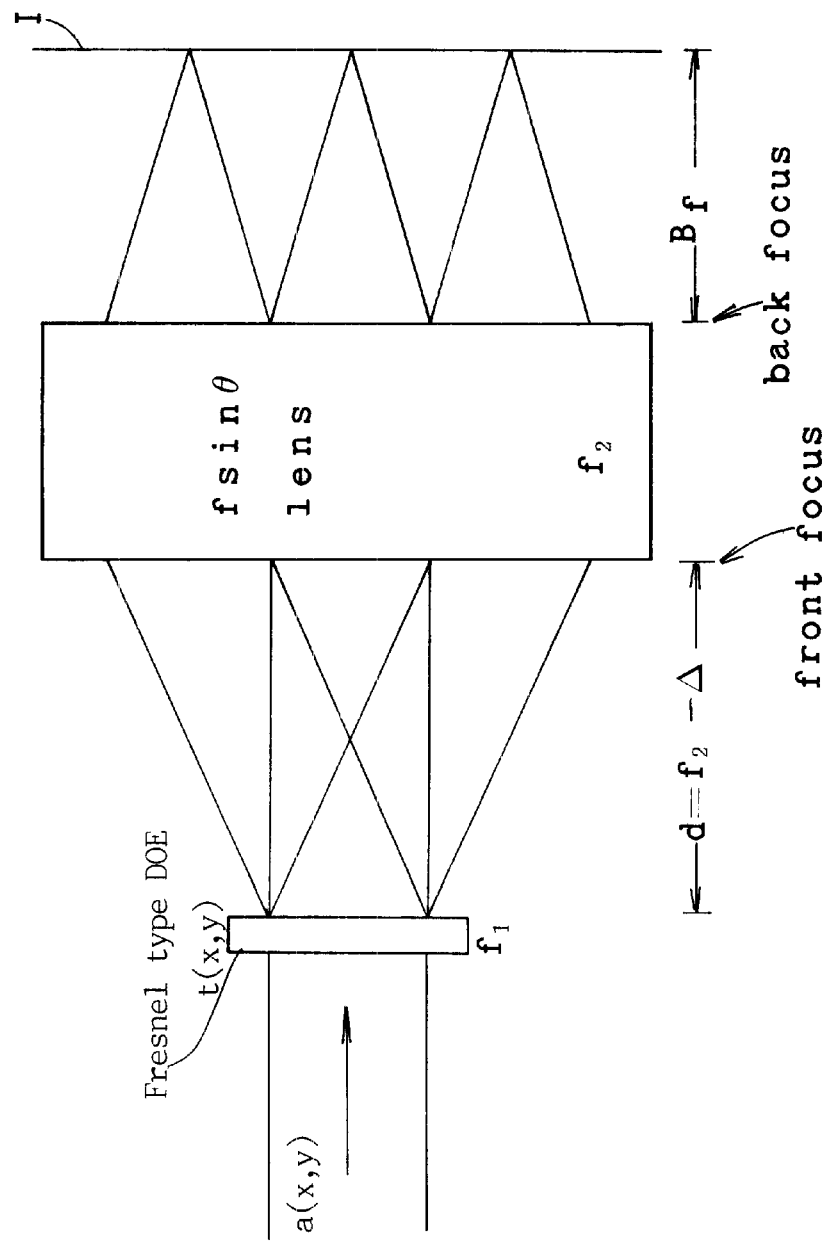
FIG. 20 is a side view of a system having a DOE, an f sin θ lens and an image plane.

FIG. 20 shows an optical system having a Fresnel DOE and an f sin θ lens. The interval between the DOE and the lens rules the size-change of patterns on the image plane. The change of the interval between the DOE and the lens enables the system to enlarge or reduce the size of patterns on the image plane. The interval d between the Fresnel DOE and the lens is denoted by $d=f_2-\Delta$. Δ is a deviation of the DOE from the neutral position $d=f_2$. $B_f$ denotes the back image distance between the f sin θ lens and the image plane.

Figure 21:
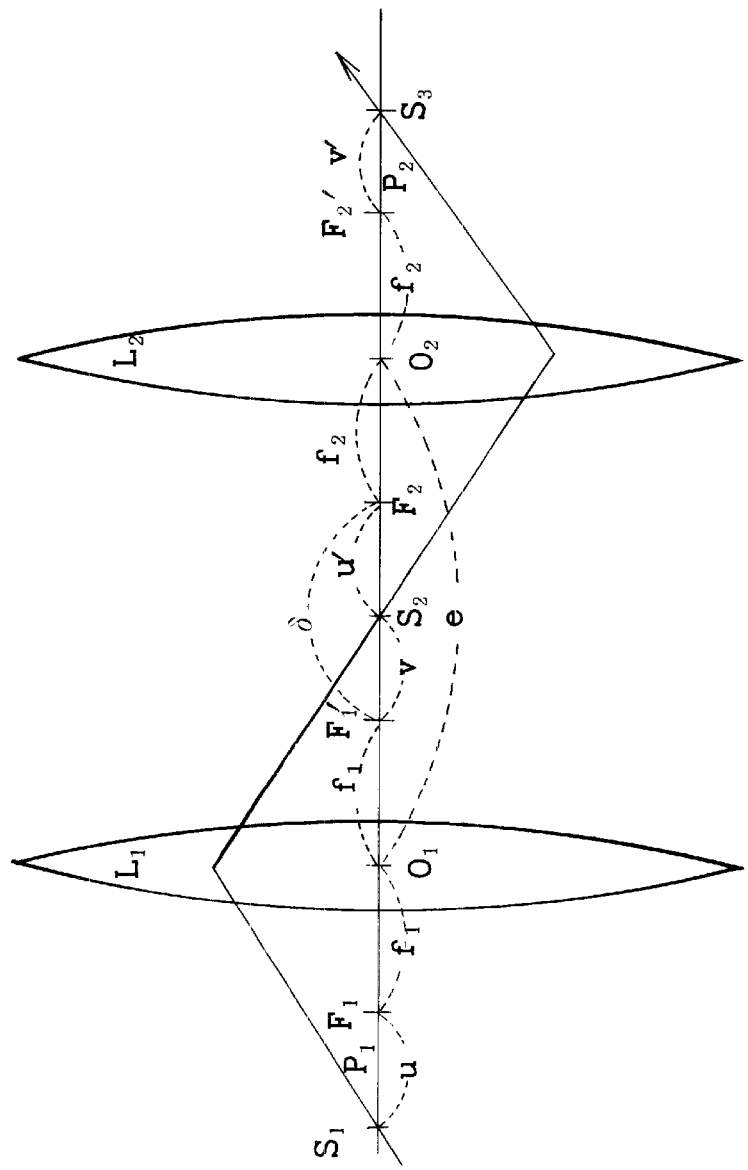
FIG. 21 is an explanatory view of a two-lens system for calculating the focal length, the focus, the magnification and the image position.

General definitions are explained about focal lengths, foci and principal points in a two thin lens optical system by referring to FIG. 21. The two lens system has a first lens L1 and a second lens L2. The first lens L1 has a focal length $f_1$. $F_1$ is the front focus for L1. $F_1'$ is the back focus of L1. $O_1$ is the principal point of L1. Since L1 is a thin lens, the front principal point is identical to the back principal point . $O_1F_1=O_1F_1'=f_1$. The second lens L2 has a focal length $f_2$. $F_2$ is the front focus of L2. $F_2'$ is the back focus of L2. $O_2$ is the principal point of L2 (front principal point=back principal point=$O_2$). $O_2F_2=O_2F_2'=f_2$. L1 is distanced by e from L2 along the optical axis $O_1O_2$. An object S1 lies on the optical axis. L1 produces an image S2 from the object S1. L2 makes an image S3 from the image S2. The distance between the object S1 and the front focus $F_1$ is denoted by "u" in the L1 system. The distance between the image S2 and the back focus $F_1'$ is denoted by "v". The distance between the image S2 and the front focus $F_2$ is denoted by "u" ' in the L2 system. The distance between the image S3 and the back focus $F_2'$ is denoted by "v'". The distance between the back focus $F_1'$ of L1 and the front focus $F_2$ of L2 is designated by δ. $δ+f_1+f_2=e$.

The thin lens formula determines the relation between the object point $(u+f_1)$ and the image point $(v+f_1)$, $$(u+f_1)^{-1}+(v+f_1)^{-1}=f_1^{-1}. \tag{33}$$

From (33), in L1, $$uv=f_1^2. \tag{34}$$

It is a well know relation that the product of the deviation of an object from the front focus and the deviation of an image from the back focus is equal to a square of focal length. Similarly, in L2, $$u'v'=f_2^2. \tag{35}$$

An extra condition is imposed from the interval of two lenses, $$v+u'=δ. \tag{36}$$

$P_1$ is defined as a front focus of two lens system. $P_1$ is calculated by the fact that an object lying on $P_1$ makes an image at an infinitely long point by L1 and L2. Substitution of infinitely large v' into Eq.(35) leads to u'=0. Eq.(36) tells that v=67 . Thus, the position $u_1$ of he front focus $P_1$ is obtained by $$u_1=f_1^2/δ. \tag{37}$$

$P_2$ is defined as a back focus of two lens system. $P_2$ is calculated by the fact that an infinitely far object makes an image at $P_2$ by L1 and L2. Substitution of infinitely large u into Eq.(34) leads to v=0. Eq.(36) tells that u'=67 . Thus, the position $v_1'$ of the back focus $P_2$ is obtained by $$v_1'=f_2^2/δ. \tag{38}$$

Two lens system requires another parameters, that is, principal points or principal planes H. The principal points are defined as two points where a magnification between the object lying at one principal point and the image lying at the other principal point is 1. The definition is rather difficult to imagine. The concept of the principal points is important for defining foci and focal lengths in the two lens system. The magnification by L1 is $f_1/u$, because of Eq.(34).

$$\text{Magnification}=(f_1+v)/(f_1+u)=v/f_1=f_1/u. \tag{39}$$

The magnification of L2 is $v'/f_2$. The product $f_1v'/f_2u$ of two magnification $f_1/u$ and $v'/f_2$ is the resultant magnification of two lens optics. The principal points H (or principal planes) are given by equalizing the magnification to 1.

$$f_1v_H'/f_2u_H=1. \tag{40}$$

The suffix "H" denotes the value at the principal points. Eq.(34), Eq.(35) and Eq.(36) produce $$v_H'=f_2(f_1+f_2)/δ \tag{41}$$

$$u_H=f_1(f_1+f_2)/δ. \tag{42}$$

The two lens system defines the focal lengths Φ as the distance between the front principal point and the front focus (which is equal to the distance between the back principal point and the back focus).

$$Φ=u_1-u_H=\frac{f_1^2}{δ}-\frac{f_1(f_1+f_2)}{δ}=-\frac{f_1f_2}{δ}. \tag{43}$$

where $δ=e-f_1-f_2$. The distance between two lenses is "e". δ is the distance between the anti counterpart foci of two lenses. The following explanation will be understood more easily by the preparatory introduction of two-lens optics.

In FIG. 20, "d" denotes the distance between the DOE and the front focus of the lens (f sin θ lens). The distance "d" is equal to "e". The DOE focal length is $f_1$ and the f sin θ lens focal length is $f_2$. When the DOE/lens distance d is equal to $f_2(e=f_2)$, the focal length of the whole system is equal to the lens focal length $f_2$. Since $e=f_2$, $δ=-f_1$ and at $Φ=f_2$ in Eq.(43). The DOE lies just at the front focus of the lens. This corresponds to the case of exact telecentricity.

When the DOE/lens distance is not just $f_2$ but is $(f_2-Δ)$, the focal length Φ varies from $f_2$. Δ is a forward deviation of the DOE from the front focus of the lens. The DOE is closer to the lens by Δ than the telecentric case. Since $e=f_2-Δ$, $δ=-f_1-Δ$. The total focal length Φ (here simply denoted by "f") is obtained by substituting δ into Eq. (43), $$f=f_1f_2/(f_1+Δ) \tag{44}$$

(case A) Δ=0. Telecentric case. $f=f_2$. The DOE is located just at the front focus of the lens.

(case B) Δ>0. The DOE is closer to the lens than case A.

If $f_1>0$ (positive lens), $f<f_2$. (45)

If $f_1<0$ (negative lens), $f>f_2$. (46)

(case C) Δ<0. The DOE is farther from the lens than case A.

If $f_1>0$ (positive lens), $f>f_2$. (47)

If $f_1<0$ (negative lens), $f<f_2$. (48)

The deviation of the DOE from the front focus of the lens changes the focal length f The change of f brings about the size-change of the patterns. The magnification of pattern is determined by f and Δ. Thus, the magnification is controlled by Δ which is the forward deviation of the DOE from the forward focus of the lens.

For example, if the DOE and the lens have focal lengths of $f_1$=500 mm and $f_2$=100 mm, 0, +10 mm, and -10 mm deviations Δ will vary f.

If Δ=0 mm, $f$=100 mm. (49)

If Δ=+10 mm, $f$=98 mm. (50)

If Δ=-10 mm, $f$=102 mm. (51)

±10 mm deviations of Δ change the focal length f by about ±2%. Then, the magnification of pattern also varies by about ±2%. In the meantime, the back image distance $B_f$ calculated from Eq.(52) changes only by 0.8 mm. Such a small change of $B_f$ alleviates the adjustment (focussing) of the distance between the lens and the image plane, i.e., the workpiece.

The problem of the 0-th order light in the DOE/lens system is explained. The back image distance $B_f$ is defined as the distance between the back principal point of the lens and the image plane (e.g. printed circuit board) in FIG. 20. The parallel beams shoot the first lens. The image is built at the back focus $v_1'$ (Eq.(38)). Since $v_1'$ is the distance from the point $F_2'$, the distance of the image from the back principal point of the lens is given by the sum $v_1'+f_2=B_f$.

$$B_f=f_2\{1-f_2/(f_1+Δ)\}. \tag{52}$$

The lens converges the parallel 0th order non-diffracted light (noise) at the back focus of $f_2$. The lens, however, converges the all orders of diffracted beams at the position of $B_f$. The converging positions deviate from each other by s.

$$s=f_2-B_f=f_2^2/(f_1+\Delta). \tag{53}$$

Namely, the lens separates the diffraction beams from the noise 0th order light. The adoption of the Fresnel DOE solves the problem of the 0th order light by separating the 0th order light's focus spatially from all the diffraction beams' image.

When the position of the image plane (e.g., printed circuit board) is determined by the distance $B_f$, the 0th order light deviates backward by s from the image plane. The 0th order light (noise) neither converges nor has enough power at the plane. The 0th order light makes no spot on the image plane. For example, if $f_1=1000$ mm, $f_2=100$ mm and $\Delta=-10$ mm to $+10$ mm, the deviation of the 0th order light is s=10 mm.

The novel point of the present invention is an assemble of a DOE and an f sin θ lens for boring small holes in printed circuit boards. Alteration between a DOE and a galvanomirror system gives excellent flexibility to this invention. The DOE itself has optionally a contrivance. The contrivance is a use of the Fresnel type DOE instead of the Fraunhofer type DOE (Fourier type). Thus, the Fresnel DOE must be clarified in comparison with the Fraunhofer DOE. First, the Fraunhofer DOE is explained with wave optics.

In FIG. 18, a monochromatic plane wave $a(x,y)\exp{kz-j\omega t}$ of a wavelength $\lambda$ enters the DOE. Plane wave is denoted by $\exp(jkz-j\omega t)$. The direction of wave propagation is the z-direction. The phase of the wave is always the same at all points on arbitrary xy-planes which are defined as a plane orthogonal to the z-axis. Since the phase is common on an xy-plane, the wavefronts are parallel to the xy-planes. The amplitude $a(x,y)$ does not include z nor t. The symbol "k" denotes a wavenumber $k=2\pi/\lambda$. $\omega$ is angular frequency $\omega=2\pi f=2\pi c/\lambda$.

A DOE is a planar plate which allows light to pass through without loss. The absolute value of transmittance is 1 at all points on the surface of the DOE. The thickness of the DOE varies locally in a unit of pixel, which gives the microstructure on the surface of DOE. The phase of the plane wave is locally changed by the modulated thickness of the DOE's microstructure. The phase varies at discrete steps which are multiples of a unit height $2\lambda/2^m$ (m is an integer). Thus, the DOE is an optical device for modulating phase of passing light by the surface microstructure. The change of the wavefunction of the light on the rear surface of the DOE is denoted by $t(x,y)$ which is perhaps named complex transmittance. Since the transmittance is 1 in an absolute value, $t(x,y)$ can be written as $t(x,y)=\exp(j\phi(x,y))$. The absolute value of $t(x,y)$ is 1 for all points. But the phase is distributed on the rear surface of the DOE. When the plane wave has passed the DOE, the light is assumed to have a wavefunction $\Psi(x,y)\exp(-j\omega t)$ on the rear surface of the DOE. The wavefunction is a direct product of the plane wavefunction and the DOE complex transparency.

$$\Psi(x,y)=a(x,y)t(x,y) \tag{54}$$

For inducing regular diffraction by the Fraunhofer DOE, the DOE should include a unit pattern which repeats regularly in the x-direction and in the y-direction. Some unit pattern repeats two dimensionally with a spatial period "$\Lambda$" in any DOE.

A converging lens of a focal length f and a center thickness D follows the DOE. The lens is parallel with xy-planes. The thickness at a point (x,y) is denoted by $q(x,y)$. The phase change induced by passing through the point (x,y) of the lens is $kD+k(n-1)q(x,y)$ with regard to the on-axial beam, where n is a refractive index. The phase change is identical to multiply an additional wavefunction $\exp\{jkD\}\exp\{jk(n-1)q(x,y)\}$ to the light which has passed the DOE.

If the converging lens is a spherical lens, the thickness function $q(x,y)$ can take an explicit simple function of x and y. $\rho_1$ and $\rho_2$ denote the curvature radii of the front surface and the rear surface of the spherical lens. The curvature radii are defined to be positive when the surface is convex in the object direction and to be negative when the surface is convex in the image direction. The focal length f is determined by $\rho_1$ and $\rho_2$ from the formula $$f^{-1}=(n-1)(\rho_1^{-1}-\rho_2^{-1}). \tag{55}$$

Geometric consideration leads to a concrete form of the thickness function $q(x,y)$ $$q(x,y)=(\rho_1^2-r^2)^{1/2}+(\rho_2^2-r^2)^{1/2}-\rho_1+\rho_2+D. \tag{56}$$

where D is the center thickness at r=0 of the lens and $$r^2=x^2+y^2. \tag{57}$$

Approximation of $q(x,y)$ of Eq.(56) in the scope of far smaller $r/\rho_1$ and $r/\rho_2$ than 1 gives, $$q(x,y)=D-(r^2/2)\{(1/\rho_1)+(-1/\rho_2)\}. \tag{58}$$

Eq.55 and Eq.58 change $k(n-1)q(x,y)$ to an explicit function of x and y, $$kD+k(n-1)q(x,y)=knD-kr^2/2f=knD-k(x^2+y^2)/2f. \tag{59}$$

The disposition of the lens following the DOE gives the phase delay of Eq.(59) to the wavefunction. The wavefunction $U(x,y)$ on the rear surface of the lens is $$U(x, y) = \Psi(x, y)\exp[jkD]\exp\{jk(n - 1)q\} = \tag{60}$$
$$a(x, y)t(x, y)\exp[jknD]\exp\left\{-\frac{jk(x^2 + y^2)}{2f}\right\}.$$

The image plane (printed circuit board) is placed at a point distanced by f from the DOE behind. The two dimensional coordinate on the image plane is denoted by $(\xi,\eta)$ for discriminating the coordinate from (x,y). Huygens' principle gives the wavefunction on the image plane by multiplying the wavefunction $a(x,y)$ with $\exp(jks)dxdy$ and integrating the product, $$\frac{U(x, y)\exp(jks)dxdy}{j\lambda f}. \tag{61}$$

where s is the distance between a point (x,y) on the lens and the spot $(\xi, \eta)$ on th image plane, $$s^2=f^2+(x-\xi)^2+(y-\eta)^2 \tag{62}$$

f is far longer than the x,y-directions, $$s = f + \frac{x^2 + y^2}{2f} + \frac{\xi^2 + \eta^2}{2f} - \frac{x\xi + y\eta}{f}. \tag{63}$$

Integration of Eq.(61) by x and y on the lens surface gives the wavefunction $V(\xi, \eta)$ on the image plane.

$$V(\xi, \eta) = \frac{1}{j\lambda f}\int\int U(x, y)\exp(jks)dxdy \quad (64)$$

$$= \frac{1}{j\lambda f}\int\int a(x, y)t(x, y)\exp\left\{-\frac{jk(x^2+y^2)}{2f}\right\}$$

$$\exp\left\{jk\left(f + \frac{x^2+y^2}{2f} + \frac{\xi^2+\eta^2}{2f} - \frac{x\xi+y\eta}{f}\right)\right\}dxdy$$

$$= \frac{1}{j\lambda f}\exp\left\{\frac{jk(\xi^2+\eta^2)}{2f}\right\}\int\int a(x, y)t(x, y)$$

$$\exp\left\{-\frac{jk(x\xi+y\eta)}{f}\right\}dxdy.$$

Here, the term $\exp\{jknD\}$ of Eq.(60) is omitted. Thus, Eq.(64) is identified to Fourier transform of $a(x,y)t(x,y)$. Namely, $h(x,y)$ is an arbitrary function defined in the xy-plane. The Fourier transform $H(\xi, \eta)$ of $h(x,y)$ is defined by $$H(\xi, \eta) = \frac{1}{j\lambda f}\int\int h(x, y)\exp\left\{\frac{-2\pi j(\xi x+\eta y)}{\lambda f}\right\}dxdy. \quad (65)$$

Then, $$V(\xi, \eta) = \left[\exp\left\{\frac{jk(\xi^2+\eta^2)}{2f}\right\}\right]\left\{AT\left(\frac{\xi}{\lambda f}, \frac{\eta}{\lambda f}\right)\right\}. \quad (66)$$

Here, "AT" is the Fourier transform of "at" (rigorously speaking, AT is a convolution of the Fourier transform of "a" and the Fourier transform of "t").

A strong pulse laser is used as a light source for boring many holes. The function $a(x,y)$ signifies the intensity distribution on the xy-plane of the Gaussian beam emitted from the strong laser. The change rate of $a(x,y)$ is far smaller than the change rate of the DOE phase modulation function $t(x,y)$. Then, it is safely assumed that $a(x,y)=1$ in the scope of the integration of x and y in short for simplifying the explanation. In the practical calculation, the beam distribution function $a(x,y)$ can be taken account. The purpose is to show a sequence of calculation for designing the DOE. Under the simple assumption, $$V(\xi, \eta) = \left[\exp\left\{\frac{jk(\xi^2+\eta^2)}{2f}\right\}\right]\left\{T\left(\frac{\xi}{\lambda f}, \frac{\eta}{\lambda f}\right)\right\}. \quad (67)$$

$V(\xi, \eta)$ is the amplitude distribution. The square of the absolute value of Eq.(67) gives the intensity distribution. The step of taking the absolute value vanishes the term of [ . . . ] of Eq.(67). Then, $$|V(\xi, \eta)|^2 = |T(k\xi/f, k\eta/f)|^2.$$

The diffraction pattern by the DOE on the image plane is given by the Fourier transform of $t(x,y)$ of the DOE.

The explanation hitherto aims at describing the occurrence of diffraction. A periodic pattern $t(x,y)$ of the DOE divides a beam into many beams, which are denoted by, generally, the n-th order diffraction ($n=0, \pm 1, \pm 2, \pm 3, \ldots$). The DOE is assumed to have a spatial period $\Lambda_x$ in the x-direction and a spatial period $\Lambda_y$ in the y-direction. The periodicity requires $t(x,y)$ of $$t(x,y)=t(x+m\Lambda_x,y+l\Lambda_y), \quad (68)$$

where $$m, l=0, \pm 1, \pm 2, \pm 3 \ldots. \quad (69)$$

In the following calculations, the integration can be separately done with regard to x and y. Then, spatial periods $\Lambda_x$ and $\Lambda_y$ in the x- and y-directions can be discriminated easily. There is no fear of confusing $\Lambda_x$ with $\Lambda_y$. Thus, the suffixes "x" and "y" are temporarily omitted from $\Lambda_x$ and $\Lambda_y$ for simplicity. $\Lambda_x$ and $\Lambda_y$ are bluntly written as "$\Lambda$". This does not mean $\Lambda_x=\Lambda_y$.

The Fourier transform $T(\xi, \eta)$ of $t(x,y)$ is $$T(\xi, \eta) = \frac{1}{j\lambda f}\int\int t(x, y)\exp\left\{\frac{-2\pi j(\xi x+\eta y)}{\lambda f}\right\}dxdy \quad (70)$$

$$= \frac{1}{j\lambda f}\sum\sum\exp\left\{\frac{-2\pi j(\xi m\Lambda+\eta l\Lambda)}{\lambda f}\right\}$$

$$\int'\int' t(x, y)\exp\left\{\frac{-2\pi j(\xi x+\eta y)}{\lambda f}\right\}dxdy.$$

The summations $\Sigma$ $\Sigma$mean that all the terms are added together with regard to m and l in accordance with Eq.(69). $\int' \int'$ signifies to integrate the following term in a fundamental unit pattern ($\Lambda_x\times\Lambda_y$) with x and y. A function $s(\xi, \eta)$ means the integration in the fundamental unit pattern.

$$s(\xi, \eta) = \frac{1}{j\lambda f}\int'\int' t(x, y)\exp\left\{\frac{-2\pi j(\xi x+\eta y)}{\lambda f}\right\}dxdy. \quad (71)$$

The function $s(\xi, \eta)$ has various versions in accordance with the design of unit patterns. The design of a DOE means just the determination of the fundamental unit pattern. The diffraction phenomenon is induced by all the phase distribution of the DOE. In the case of the Fraunhofer DOE, a DOE has the repetitions of the basic pattern. The design of a DOE can be simply reduced to a determination of the fundamental unit pattern $s(\xi, \eta)$.

$$T(\xi, \eta)=\Sigma\Sigma\exp\{-2\pi j(\xi m\Lambda+\eta l\Lambda)/f\lambda\}s(\xi, \eta). \quad (72)$$

The fundamental patterns ($\Lambda_x\times\Lambda_y$) are repeated K times in the x-direction and H times in the y-direction. The summations can be calculated with regard to l and m without taking account of $s(\xi, \eta)$.

$$T(\xi, \eta) = \frac{s(\xi, \eta)\sin\left(\frac{\pi K\xi\Lambda}{\lambda f}\right)\sin\left(\frac{\pi H\eta\Lambda}{\lambda f}\right)}{\sin\left(\frac{\pi\xi\Lambda}{\lambda f}\right)\sin\left(\frac{\pi\eta\Lambda}{\lambda f}\right)}. \quad (73)$$

The equation expresses a discrete set of diffraction points. Why can Eq.(73) signify the diffraction points? When $\xi$ is not a multiple of $\lambda f/\Lambda$ in the x-direction, $|\sin(\pi K\xi\Lambda/\lambda f)/\sin(\pi\xi\Lambda/\lambda f)|$ takes a far smaller value than K. When $\epsilon$ is a multiple of $\lambda f/\Lambda$ in the x-direction, $|\sin(\pi K\xi\Lambda/\lambda f)/\sin(\pi\xi\Lambda/\lambda f)|$ takes a big value K. Similarly, in the y-direction, $|\sin(\pi H\eta\Lambda/f\lambda)/\sin(\pi\eta\Lambda/f\lambda)|$ takes a big value X only when $\eta$ is a multiple of $\lambda f/\Lambda$. Thus, $T(\xi, \eta)$ takes an enough large definite value only when $\xi$ is a multiple of $\lambda f/\Lambda$ and 72 is a multiple of $\lambda f/\Lambda$. Otherwise, $T(\xi, \eta)$ is nearly zero. Thus, the repetitions of patterns of the Fourier type DOEs can be related to the above singularity.

The value of $\lambda f/\Lambda$ should be predetermined to be equal to the pitch of holes to be bored. Then, the laser beams diffracted by the DOE and converged by the f sin θ lens can perforate many micro holes with the desired interval on the board at an instant.

The explanation hitherto relates to the Fourier type (Fraunhofer type) DOE which split the incident beam into multiple beams. Then a novel Fresnel type DOE will be explained.

FIG. 19 shows a Fresnel type DOE. The amplitude of a plane wave is denoted by $a(x,y)$. The change of the wavefunction induced by the DOE is designated by $t(x,y)$. The wavefunction of the light which has passed the DOE is expressed by $\Psi(x,y)\exp(-j\omega t)$.

$$\Psi(x,y)=a(x,y)t(x,y). \tag{74}$$

Since the Fresnel DOE has converging power itself, the converging lens can be omitted. Instead of Eq.(64), the wavefunction $V(\xi, \eta)$ on the image plane distanced by f is reduced to $$V(\xi, \eta) = \frac{1}{j\lambda f} \int\int \Psi(x, y)\exp(jks)dxdy. \tag{75}$$

Here, "s" is the distance between a point $(x,y)$ on the back surface of the DOE and a spot $(\xi, \eta)$ on the image plane.

$$s^2=f^2+(x-\xi)^2+(y-\eta)^2. \tag{76}$$

$V(\xi, \eta)$ can be calculated as follows, $$V(\xi, \eta) = \frac{1}{j\lambda f}\int\int a(x,y)t(x,y) \tag{77}$$
$$\exp\left\{jk\left(f+\frac{x^2+y^2}{2f}+\frac{\xi^2+\eta^2}{2f}-\frac{x\xi+y\eta}{f}\right)\right\}dxdy$$
$$= \frac{1}{j\lambda f}\left[\exp\left\{\frac{jk(\xi^2+\eta^2)}{2f}\right\}\right]$$
$$\int\int a(x,y)t(x,y)\exp\left\{\frac{jk(x^2+y^2)}{2f}\right\}$$
$$\exp\left\{-\frac{jk(x\xi+y\eta)}{f}\right\}dxdy.$$

Comparison of Eq.(77) with Eq.(64) teaches us that the Fresnel DOE includes additional term $\exp\{jk(x^2+y^2)/2f\}$ in the integral because of the lack of the converging lens. Here, an assumption of $a(x,y)=1$ simplifies the further explanation. $T(\xi/\lambda f, \eta/\lambda f)$ is defined as a Fourier transform of $t(x,y)\exp\{jk(x^2+y^2)/2f\}$.

$$V(\xi, \eta) = \left[\exp\left\{\frac{jk(\xi^2+\eta^2)}{2f}\right\}\right]\left\{T\left(\frac{\xi}{\lambda f}, \frac{\eta}{\lambda f}\right)\right\}. \tag{78}$$

This is apparently the same as Eq.(67) of the Fraunhofer DOE. But $T(k\xi/f, k\eta/f)$ is different. In the Fresnel DOE, $t(x,y)\exp\{jk(x^2+y^2)/2f\}$ should be a periodic function. Instead of the simple periodic condition of the Fraunhofer DOE $$t(x,y)=t(x+m\Lambda_x, y+l\Lambda_y) \tag{68}$$

$$m, l=0, \pm1, \pm2, \pm3, \ldots, \tag{69}$$

the Fresnel DOE requires more complex periodic condition, $$t(x, y)\exp\left\{\frac{jk(x^2+y^2)}{2f}\right\} = \tag{79}$$
$$t(x+m\Lambda_x, y+l\Lambda_y)\exp\left[\frac{jk\{(x+m\Lambda_x)^2+(y+l\Lambda_y)^2\}}{2f}\right].$$

$$m, l=0, \pm1, \pm2, \pm3, \ldots \tag{80}$$

Under the modulated periodic condition, the Fourier transform $S(\xi, \eta)$ of $t(x,y)\exp\{jk(x^2+y^2)/2f\}$ is $$S(\xi, \eta) = \frac{1}{j\lambda f}\int\int t(x, y)\exp\left\{\frac{jk(x^2+y^2)}{2f}\right\} \tag{81}$$
$$\exp\left\{\frac{-2\pi j(\xi x+\eta y)}{\lambda f}\right\}dxdy$$
$$= \frac{1}{j\lambda f}\sum\sum \exp\left\{\frac{-2\pi j(\xi m\Lambda_x+\eta l\Lambda_y)}{\lambda f}\right\}$$
$$\int'\int' t(x, y)\exp\left\{\frac{jk(x^2+y^2)}{2f}\right\}$$
$$\exp\left\{\frac{-2\pi j(\xi x+\eta y)}{\lambda f}\right\}dxdy.$$

Here, $\int'\int'$ denotes an integration within a unit pattern. The integration within the unit pattern is now denoted by $\sigma(p,q)$.

$$\sigma(\xi, \eta) = \tag{82}$$
$$\frac{1}{j\lambda f}\int'\int' t(x, y)\exp\left\{\frac{jk(x^2+y^2)}{2f}\right\}\exp\left\{\frac{-2\pi j(\xi x+\eta y)}{\lambda f}\right\}dxdy.$$

Then, the Fourier transformation $S(\xi, \eta)$ is $$S(\xi, \eta) = \frac{\sigma(\xi, \eta)\sin\left(\frac{\pi K\xi\Lambda_x}{\lambda f}\right)\sin\left(\frac{\pi H\eta\Lambda_y}{\lambda f}\right)}{\sin\left(\frac{\pi\xi\Lambda_x}{\lambda f}\right)\sin\left(\frac{\pi\eta\Lambda_y}{\lambda f}\right)}. \tag{83}$$

It is easily understood that the Fourier transform within the unit pattern is $\sigma(\xi, \eta)$. However, the modulated periodic condition of Eq.(79) is imposed upon the Fresnel DOE. The design of Fresnel DOE is more difficult than the design of the Fraunhofer DOE. The periodic condition is represented by $$t(x+m\Lambda_x, y+l\Lambda_y) = \tag{84}$$
$$t(x, y)\exp\left\{-\frac{jk(mx\Lambda_x+ly\Lambda_y)}{f}\right\}\exp\left\{-\frac{jk(\Lambda_x^2 m^2+\Lambda_y^2 l^2)}{2f}\right\}.$$

The requirement for the DOE is an irregular condition. The DOE is not built with repetitions of the same fundamental unit pattern. The unit pattern should be modulated with the function including m and l which denote the number of patterns. The production of the Fresnel DOE is more difficult than the Fraunhofer DOE, since the DOE should be assemble modulated patterns. In spite of the difficulty, the Fresnel DOE has the advantages of avoiding the problem of the 0-th order light and the difficulty of size-change. The intrinsic drawback of the lack of the flexibility is similar to the Fresnel DOE.

However, this invention can solve the difficulty of the lack of the flexibility by combining the highly flexible galvanomirror system with the DOE system. The assembly of the DOE and the galvanomirror endows this invention with high speed processing and the rich flexibility.

Figure 12:
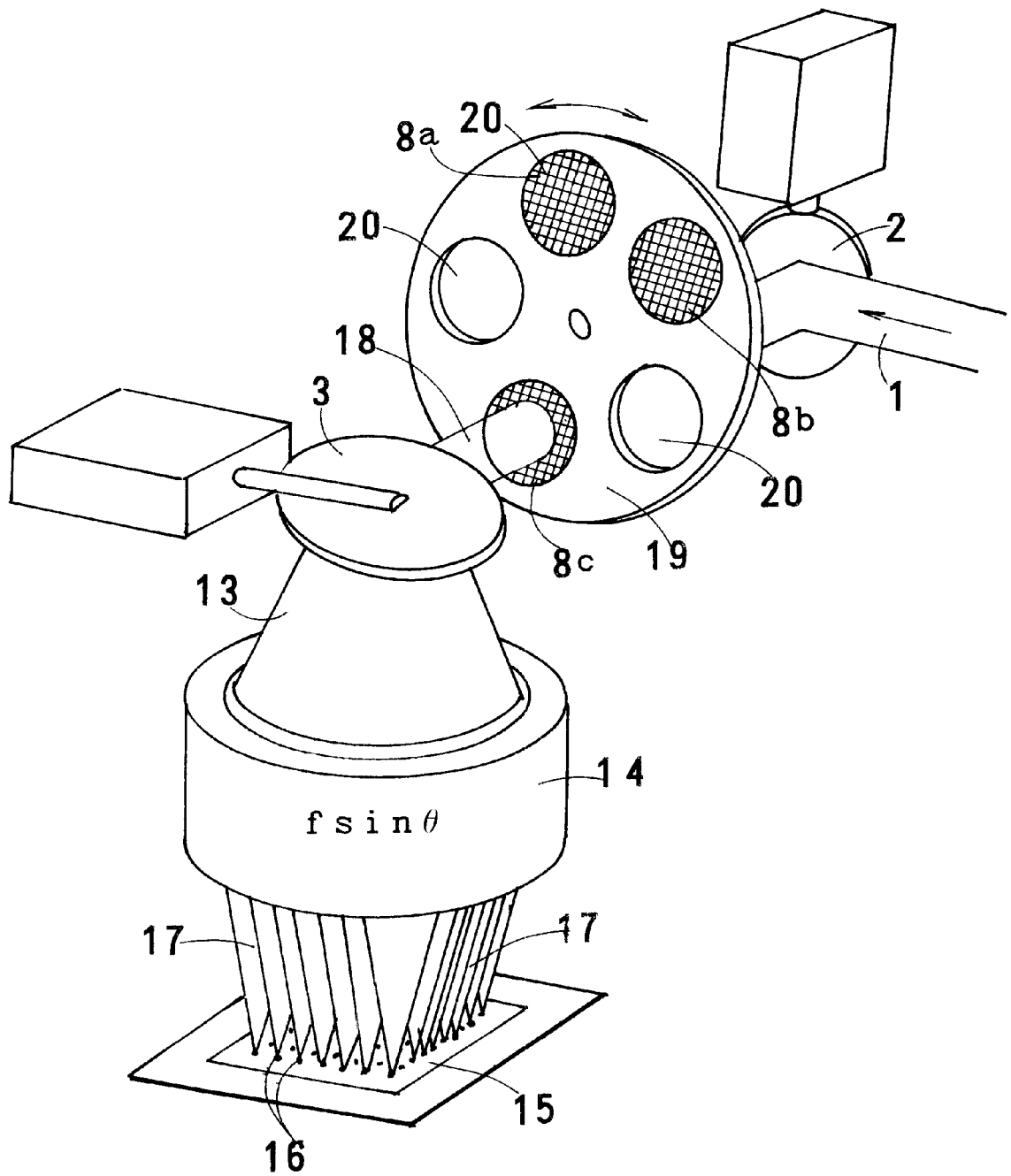
FIG. 12 is a perspective view of a hybrid type laser boring apparatus of the present invention which combines the galvanomirror beam scanning system with the DOE beam diffraction system.

In FIG. 12, in the case of exchanging the galvanomirror system and the Fresnel DOE, an open window of the rotary disc should be provided with a lens having the same focal length as the Fresnel DOE.

[Embodiment 1 (Fraunhofer Type (Fourier Type) DOE+f sin θ Lens)]

An embodiment making use of the Fraunhofer type DOE which only divides a beam into a plurality of beams. The DOE is called "Fraunhofer type", because the DOE can be treated with the Fraunhofer diffraction theory. The diffraction can be formulated by the Fourier transform of the phase distribution. Thus, the DOE is also called "Fourier type". They are synonyms. The Fraunhofer DOE which has no power of convergence requires a converging lens. As aforementioned, the most suitable lens is an f sin θ lens for the DOE. Then, the f sin θ lens is employed for converging the DOE passing beams. But the f sin θ lens is novel itself and is not sold on the market yet. A suitable f sin θ lens should be designed and produced for carrying out the experiment.

[Design of DOE]
o Spatial period $\Lambda=192.308$ μm ($\Lambda_x=\Lambda_y$)
o Diffraction order n=0, 1, 2, 3, 4, 5

This design aims at boring five holes aligning at a 5 mm interval in a printed circuit board put at the focus of the f sin θ lens.

[Design of f sin θ Lens]

(A) Initial design of lenses

| | |
|---|---|
| Lens | Two lenses, material: ZnSe (n = 2.403) |
| First lens L1 | First surface S1 and second surface S2 are spherical. |
| Second lens L2 | First surface S3 is spherical. Second surface S4 is aspherical. |
| Wavelength | $\lambda = 10.6$ μm (for $CO_2$ laser) |
| Entrance pupil | a point distanced by 50 mm from the first lens L1 to the object side |
| F-number | 6 |
| Output angle | 0 degree (telecentric) |

(B) Choice of variables

Curvature radii of surfaces, thickness of lenses, spacing between lens surfaces, aspherical coefficients and position of image plane are variables.

(C) Restrictions

| | |
|---|---|
| Focal length | f = 127 mm |
| Lens thickness | more than 3.5 mm and less than 15 mm (T = 3.5 mm~15 mm) |

(D) Result of Lens Design

TABLE 3 f sin θ lens data

| Lens No. | Surface No. | Curvature Radius (mm) | Thickness, Spacing | Refractive Index |
|---|---|---|---|---|
| L1 | S1 | −31.119 | 5.650 | 2.403 |
| | S2 | −35.100 | 65.255 | |

TABLE 3-continued f sin θ lens data

| Lens No. | Surface No. | Curvature Radius (mm) | Thickness, Spacing | Refractive Index |
|---|---|---|---|---|
| L2 | S3 | 392.630 | 9.504 | 2.403 |
| | S4 | Table.4 | 147.661 | |

TABLE 4

Aspherical lens data of f sin θ lens

| Surface No. | S4 | | Aspherical Coefficient |
|---|---|---|---|
| 1/c (mm) | −351.089 | $\alpha_2$ | $5.876 \times 10^{-9}$ |
| k | −4.352 | $\alpha_3$ | $2.959 \times 10^{-12}$ |
| | | $\alpha_4$ | $-1.466 \times 10^{-15}$ |
| | | $\alpha_5$ | $2.702 \times 10^{-19}$ |

Experiments of boring holes at a 5 mm interval in a printed circuit board are carried out by making use of the f sin θ lens of the present invention and the fθ lens previously described in Tables 1 and 2 as a converging lens for the purpose of comparison. The sizes of the holes and the hole intervals are measured in both cases. The intervals between the holes bored by higher order diffraction increase in the case of using the fθ lens. Table 5 shows the position errors of the fifth order hole in both the fθ lens apparatus and the f sin θ lens apparatus. The fifth order hole is bored at a spot distanced by 25.26 mm from the origin by the fθ lens apparatus. ±20 μm is the tolerance allowed for boring holes in printed circuit boards in general. A big error of +260 μm accompanies the fθ lens apparatus. Such an apparatus is of no use. On the contrary, the errors of hole positions are less than ±20 μm in the apparatus making use of the f sin θ lens.

TABLE 5

Position errors of the fifth order hole
in both the f θ lens apparatus and the f sin θ lens apparatus

| | ideal value | f θ lens | f sin θ lens |
|---|---|---|---|
| hole position | 25 mm | 25.26 mm | 25.00 mm |
| error | — | +260 μm | 0 μm |

Figure 8:
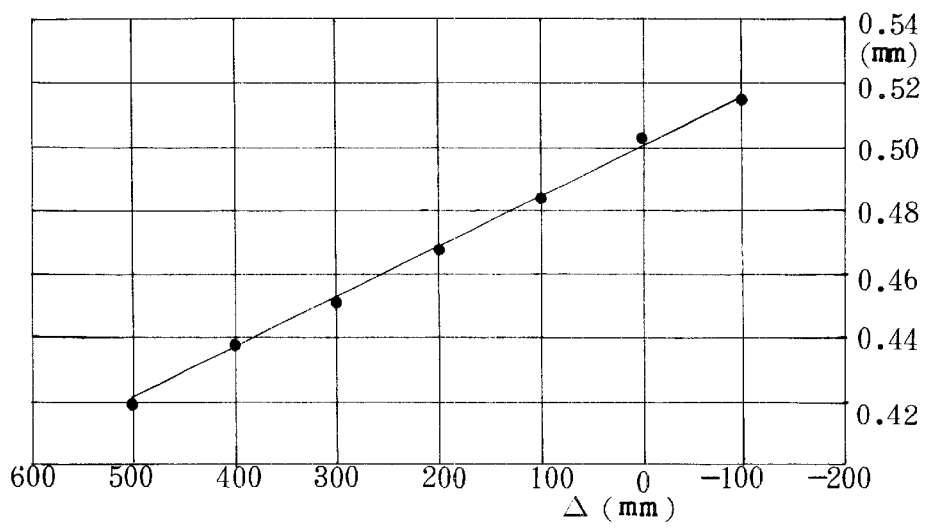
FIG. 8 is a graph showing the relation between the deviation Δ of the DOE and the spot interval of diffraction beams in the system having a 0.50 mm spot interval for the zero-deviation (Δ=0) which means that the DOE lies at the front focus of the lens.

FIG. 8 is a graph showing the variations of the spot intervals from 0.5 mm which are produced by displacing the DOE by Δ from the front focus toward the laser. Abscissa is the deviation Δ of the DOE from the front focus (in a unit of mm). Ordinate is the spot interval 15 (in a unit of mm). The given values of parameters are a=3302 mm, b=132 mm, f=127 mm and M=0.04. The graph teaches us that the displacement of the DOE can vary the hole interval in a restricted scope. The hole interval can be controlled within a scope of Δ which maintains the telecentricity.

[Embodiment 2 (Fresnel Type DOE+f sin θ Lens)]

Another embodiment relates to a new type DOE having a converging function and a finite focal length. The new DOE is called a Fresnel type DOE. The DOE is an assembly of a Fraunhofer DOE and a lens on function. The use of the Fresnel DOE brings about two advantages. One is to eliminate the influence of the 0th order light. The other is the high freedom of size-change (enlargement or reduction) by changing the position of the DOE.

Since the Fresnel DOE has a finite focal length, the DOE can produce a diffraction pattern on an image plane placed at the focal length without a converging lens. However, the sole DOE cannot simultaneously bore many holes in a wide area of an object printed circuit board without losing telecentricity. For compensating the deficit of the convergence, a converging lens is provided at the back of the Fresnel DOE. In the case of the Fresnel DOE, the f sin θ lens is a suitable lens.

But the f sin θ lens preferable for the Fresnel DOE is different from the f sin θ lens suitable for the Fraunhofer DOE. The Fresnel DOE generates converging diffraction beams (positive f) or diverging diffraction beams (negative f). Blunt diversion of the Fraunhofer f sin θ lens to the Fresnel DOE would bring about field curvature. The Fresnel DOE requires a new design of a suitable f sin θ lens.

The Fresnel DOE can also be assembled with the galvanomirror system as shown in FIG. 12. In the case, when the galvanomirror is chosen, an extra lens having the same focal length as the Fresnel DOE should be inserted in the optical path of the galvanomirror system for adjusting the position of the object plane with the Fresnel DOE.

[Design of DOE]
○ Focal length $f_1 = -500$ mm (negative refractive power).
○ Spatial period $\Lambda = 192.308$ μm ($\Lambda_x = \Lambda_y$)
○ Diffraction order $n = 0, 1, 2, 3, 4, 5$ This design aims at boring five holes aligning at a 5 mm interval in a printed circuit board put at the focus of the f sin θ lens

[Design of f sin θ Lens]

(A) Initial design of lenses

| | |
|---|---|
| ○ Lens | Two lenses, material: ZnSe (n = 2.403) |
| First lens L1 | First surface S1 is aspherical. Second surface S2 is spherical. |
| Second lens L2 | First surface S3 is spherical. Second surface S4 is aspherical. |
| ○ Wavelength | λ = 10.6 μm (for $CO_2$ laser) |
| ○ Entrance pupil | a point distanced by 50 mm from the first lens L1 to the object side |
| ○ F-number | 6 |
| ○ Output angle | 0 degree (telecentric) |

(B) Choice of Variables

Curvature radii of surfaces, thickness of lenses, spacing between lens surfaces, aspherical coefficients and position of image plane are variables.

(C) Restrictions

| | |
|---|---|
| ○ Focal length | f = 127 mm |
| ○ Lens thickness | more than 3.5 mm and less than 15 mm (T = 3.5 mm~15 mm) |

(D) Result of Lens Design

TABLE 6 f sin θ lens data

| Lens No. | Surface No. | Curvature Radius (mm) | Thickness, Spacing | Refractive Index |
|---|---|---|---|---|
| L1 | S1 | Table.7 | 5.478 | 2.403 |
| | S2 | −37.034 | 68.782 | |
| L2 | S3 | 1962.525 | 10.740 | 2.403 |
| | S4 | Table.8 | 179.560 | |

TABLE 7

Aspherical lens data of f sin θ lens

| Surface No. | S4 | | Aspherical Coefficient |
|---|---|---|---|
| 1/c (mm) | −33.041 | $\alpha_2$ | $1.855 \times 10^{-7}$ |
| k | 0.059 | $\alpha_3$ | $-1.974 \times 10^{-10}$ |
| | | $\alpha_4$ | $6.943 \times 10^{-13}$ |
| | | $\alpha_5$ | $-1.716 \times 10^{-16}$ |

TABLE 8

Aspherical lens data of f sin θ lens

| Surface No. | S4 | | Aspherical Coefficient |
|---|---|---|---|
| 1/c (mm) | −204.464 | $\alpha_2$ | $-1.024 \times 10^{-8}$ |
| k | −1.717 | $\alpha_3$ | $-3.485 \times 10^{-12}$ |
| | | $\alpha_4$ | $1.877 \times 10^{-15}$ |
| | | $\alpha_5$ | $-3.008 \times 10^{-19}$ |

Figure 17:
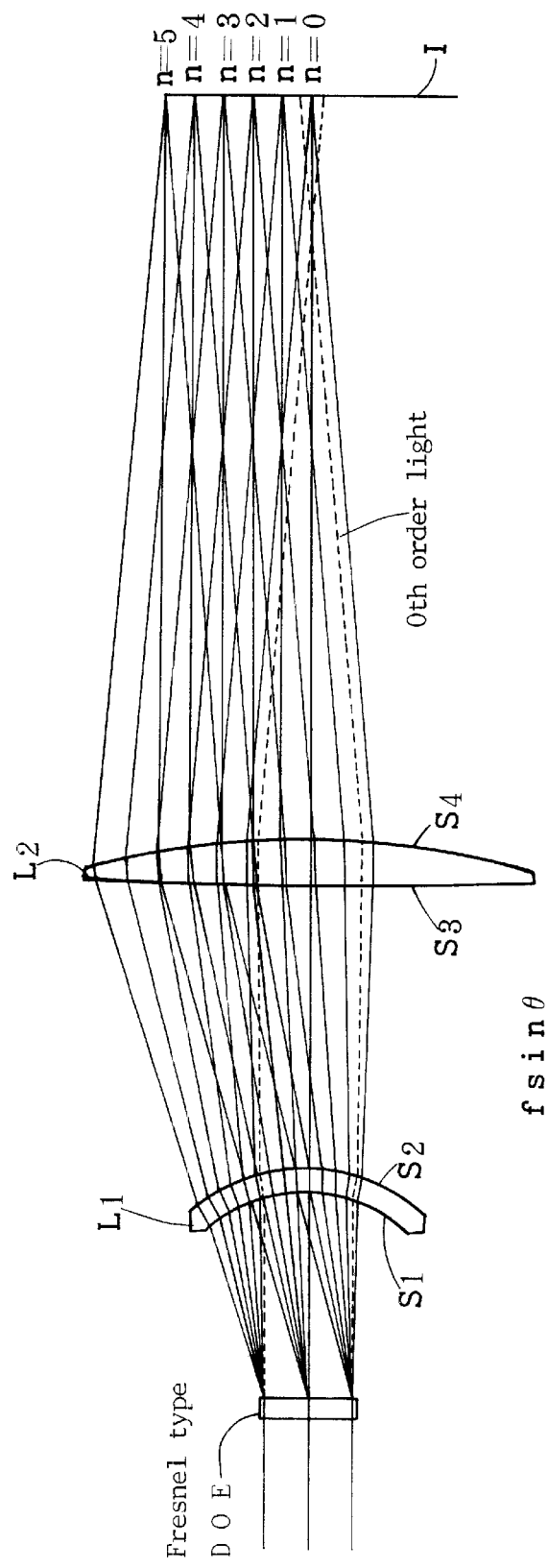
FIG. 17 is a side view of Embodiment 2 having a Fresnel DOE and an f sin θ lens.

Experiments of boring holes at a 5 mm interval in a printed circuit board are carried out by making use of the f sin θ lens of the present invention and the fθ lens previously described in Tables 1 and 2 as a converging lens for the purpose of comparison. FIG. 17 shows the hole boring optical system by the Fresnel DOE and the f sin θ lens. The sizes of the hole intervals are measured in both cases. The intervals between the holes bored by higher order diffraction increase in the case of using the fθ lens.

Table 9 shows the position errors of the fifth order hole in both the fθ lens apparatus and the f sin θ lens apparatus. The fifth order hole is bored at a spot distanced by 25.26 mm from the origin by the fθ lens apparatus. ±20 μm is the tolerance allowed for boring holes in printed circuit boards in general. A big error of +260 μm accompanies the fθ lens apparatus. Such an apparatus is of no use. On the contrary, the errors of hole positions are less than ±20 μm in the apparatus making use of the f sin θ lens.

TABLE 9

Position errors of the fifth order hole
in both the f θ lens apparatus and the f sin θ lens apparatus

| | ideal value | f θ lens | f sin θ lens |
|---|---|---|---|
| hole position | 25 mm | 25.26 mm | 25.00 mm |
| error | — | +260 μm | 0 μm |

The performance described hitherto is similar to the case of the Fraunhofer DOE. The Fresnel DOE has still extra advantages over the Fraunhofer DOE.

[Increase of the Range of Size-change]

The Fresnel DOE itself has the divergence property of $f_1 = -500$ mm. The finite focal length enables the Fresnel DOE to enlarge or reduce the image by the following reason. The integrated focal length f of the DOE and the lens is given by, $$f = f_1 f_2/(f_1 + \Delta) \qquad (85)$$

Here, Δ is the forward deviation of the DOE from the forward focus of the lens. For the case of a positive deviation $\Delta > 0$, when $f_1 2 1 \ 0$, then $f > f_2$, but when $f_1 > 0$, then $f < f_2$. On the contrary, for the case of a negative deviation $\Delta < 0$, when $f_1 < 0$, then $f < f_2$, but when $f_1 > 0$, then $f > f_2$. The Fresnel DOE has a finite focal length which allows the change of the integration focal length f.

Embodiment 2 uses the DOE of $f_1=-500$ mm and the lens of $f_2=127$ mm. Substitution $f_1$ and $f_2$ into Eq.(85) leads to the integrated focal length $$f=500\times127/(500-\Delta). \tag{86}$$

For example, $$\text{when } \Delta=+15 \text{ mm}, f=130.9 \text{ mm}. \tag{87}$$

$$\text{when } \Delta=-15 \text{ mm}, f=123.3 \text{ mm}. \tag{88}$$

The size of the image (enlargement or reduction) is nearly in proportion with the focal length f. Embodiment 2 shows that about ±3% changes of focal length f are induced by ±15 mm changes of $\Delta$. Then, the change of $\Delta$ enables the system to change the size of the image of about ±3%. As mentioned before, the Fraunhofer DOE has a smaller scope of ±1% of size change. Embodiment 2 basing upon the Fresnel DOE allows the image size change of three times as large as Embodiment 1. Embodiment 2 can reduce the image size down to 97%. Embodiment 2 can enhance the image size up to 103%.

[Exclusion of the 0th-order Light]

The focus of the 0th-order light exists in front of the image plane as shown in FIG. 17. The 0th order light does not converge on the image plane. The 0th order light has no influence upon the image. The Fresnel DOE can exclude the 0th order light. How far is the 0th order light focus separated from the image plane? For $\Delta=-15$ mm to +15 mm, $$\text{Separation} = f_2^2/(f_1+\Delta) = 127^2/(-500+\Delta) \tag{89}$$

$$= -31.3 \text{ mm to } -33.3 \text{ mm}. \tag{90}$$

The 0th order focus is always separated from the image plane by a distance more than 30 mm in the range of $\Delta=-15$ mm to +15 mm. The 0th order light is faint noise at the image plane. The 0th order light has almost no intensity for burning a hole on the print board. Namely, Embodiment 2 succeeds in eliminating the 0th order light.

[Adjustment of Image Plane]

When the DOE is displaced by $\Delta$ from the forward focus of the lens, the focal length f changes. The change of f requires the adjustment of the image plane. But the adjustment is easy due to the small change of f. In Embodiment 2, $f_1=-500$ mm and $f_2=127$ mm give the back image distance $B_f$ $$B_f = f_2\{1-f_2/(f_1+\Delta)\} \tag{91}$$

$$= 127\times\{1+127/(500-\Delta)\}. \tag{92}$$

When $\Delta=-15$ mm to +15 mm, $$B_f=160.3 \text{ mm to } 158.3 \text{ mm}. \tag{93}$$

The change of $B_f$ is only 2 mm. Focussing can be done easily by changing slightly the distance between the lens and the object board (image plane).

What is claimed is:

1. A laser hole boring apparatus comprising:
   a laser emitting a laser beam;
   a diffractive optical element having surfaces and a microstructure on the surface, which is formed by repetition of similar unit patterns having identical pixel distribution placed with a definite spatial period in an x-direction and in a y-direction or by modulation of the repeated similar unit patterns having identical pixel distribution for diffracting the laser beam into a plurality of diffraction beams, said diffraction beams having respectively different diffraction angles of two-dimensional distribution; and
   an f sin θ lens for converging the diffraction beams into a plurality of spots on an object for burning out holes.

2. A laser hole boring apparatus as claimed in claim 1, wherein a plurality of diffractive optical elements are fitted to a plurality of windows of a rotary disc, the rotary disc is placed at a point where the laser beam shoots one window of the rotary disc and the diffractive optical elements are changed by rotating the rotary disc.

3. A laser hole boring apparatus as claimed in claim 1, wherein a hole interval is enlarged or reduced by displacing the diffractive optical element toward the laser or toward the lens.

4. A laser hole boring apparatus as claimed in claim 1, further comprising a device for adjusting a divergence angle of the laser beam such that a hole interval can be enlarged or reduced.

5. A laser hole boring apparatus as claimed in claim 4, wherein the device for adjusting a divergence angle of the laser beam is a beam expander having at least two lenses and a hole interval is enlarged or reduced by changing a distance between the lenses.

6. A laser hole boring apparatus as claimed in claim 1, wherein said diffractive optical element is configured to be displaced toward the laser or toward the lens such that a hole interval can be enlarged or reduced.

7. A laser hole boring apparatus, comprising:
   a laser emitting a laser beam;
   a diffractive optical element having surfaces and a microstructure on the surface, which is formed by repetition of similar patterns with a definite spatial period or by modulation of the repeated patterns for diffracting the laser beam into a plurality of diffraction beams; and
   an f sin θ lens for converging the diffraction beams into a plurality of spots on an object for burning out holes,
   wherein the diffractive optical element is a Fresnel diffractive optical element which has surfaces and a microstructure on the surface formed by the modulation of the repeated similar patterns with a definite spatial period, and denoted by complex transmittance function t(x,y) showing complex transmittance at point (x,y) in the pattern and the transmittance function satisfies a modulated cyclic condition, $$t(x+m\Lambda_x,y+1\Lambda_y)=t(x,y)\exp\{-jk(mx\Lambda_x+1y\Lambda_y)/f\}\exp\{-jk(m^2\Lambda_x^2+1^2\Lambda_y^2)/2f\},$$

where k is a wavenumber of the laser light, $\Lambda_x$ is a spatial period in the x-direction, $\Lambda_y$ is a spatial period in the y-direction, f is a focal length and m and 1 are integers below numbers of pattern repetitions.

8. A laser hole boring apparatus, comprising:
   a laser emitting a laser beam;
   a diffractive optical element having surfaces and a microstructure on the surface, which is formed by repetition of similar patterns with a definite spatial period or by modulation of the repeated patterns for diffracting the laser beam into a plurality of diffraction beams; and
   an f sin θ lens for converging the diffraction beams into a plurality of spots on an object for burning out holes,
   wherein the diffractive optical element is a Fraunhofer diffractive optical element which has surfaces and a microstructure on the surface formed by the repetition of the similar patterns with a definite spatial period, and denoted by complex transmittance function t(x,y) showing complex transmittance at point (x,y) in the pattern and the transmittance function satisfies a cyclic condition, $$t(x+m\Lambda_x, y+1\Lambda_y)=t(x,y)$$

where k is a wavenumber of the laser light, $\Lambda_x$ is a spatial period in the x-direction, $\Lambda_y$ is a spatial period in the y-direction and m and 1 are integers below numbers of pattern repetitions.

9. A laser hole boring apparatus comprising:

a laser emitting a laser beam;

one or two swaying galvanomirrors for scanning the laser beam;

a diffractive optical element having surfaces and a microstructure on the surface, which is formed by repetition of similar patterns with a definite spatial period or by modulation of the repeated patterns for diffracting the laser beam into a plurality of diffraction beams;

an f sin θ lens for converging the diffraction beams from the diffractive optical element or the deflected beam from the galvanomirrors at a plurality of spots on an object for burning out holes; and a device for putting the diffractive optical element in and out of a laser beam path.

10. A laser hole boring apparatus as claimed in claim 9, wherein the diffractive optical element is inserted in or removed from a middle position between two galvanomirrors.

11. A laser hole boring apparatus as claimed in claim 10, wherein a plurality of diffractive optical elements are fitted to a plurality of windows of a rotary disc, the rotary disc is placed at a point where the laser beam reflected by the galvanomirror shoots one window of the rotary disc and the diffractive optical elements are changed by rotating the rotary disc.

12. A laser hole boring apparatus as claimed in claim 11, wherein a plurality of diffractive optical elements are fitted to a plurality of windows of a rotary disc, at least one of the windows of the rotary disc is left open, the rotary disc is placed at a point where the laser beam reflected by the galvanomirror shoots the open window or the diffractive optical element window of the rotary disc and the diffractive optical elements and the galvanomirror are changed alternatively by rotating the rotary disc.

13. A laser hole boring apparatus as claimed in claim 11, wherein the diffractive optical elements are Fresnel diffractive optical elements, a plurality of Fresnel diffractive optical elements are fitted to a plurality of windows of a rotary disc, at least one of the windows of the rotary disc is provided with a lens having the same focal length as the Fresnel diffractive optical element, the rotary disc is placed at a point where the laser beam reflected by the galvanomirror shoots the lens window or the diffractive optical element window of the rotary disc and the diffractive optical elements and the galvanomirror are changed alternatively by rotating the rotary disc.

14. A laser hole boring apparatus, comprising:

a laser emitting a laser beam;

a diffractive optical element having surfaces and a microstructure on the surface, which is formed by repetition of similar patterns with a definite spatial period or by modulation of the repeated patterns for diffracting the laser beam into a plurality of diffraction beams; and an f sin θ lens for converging the diffraction beams into a plurality of spots on an object for burning out holes, said laser hole boring apparatus further comprising a pinhole mask, wherein a magnification is changed by displacing the pinhole mask either toward the laser or toward the diffractive optical element and a hole interval is enlarged or reduced by displacing the diffractive optical element toward the pinhole mask or toward the lens.

\* \* \* \* \*

UNITED STATES PATENT AND TRADEMARK OFFICE
CERTIFICATE OF CORRECTION

PATENT NO.    : 6,452,132 B1                                           Page 1 of 1
DATED         : September 17, 2002
INVENTOR(S)   : Fuse It is certified that error appears in the above-identified patent and that said Letters Patent is hereby corrected as shown below:

<u>Title page,</u>
Item [*] Notice, "Subject to any disclaimer, the term of this patent is extended or adjusted under 35 USC 154(b) by (6) days", delete the phrase "by 6 days" and insert -- by 0 days --

Signed and Sealed this

Fourteenth Day of October, 2003

JAMES E. ROGAN
*Director of the United States Patent and Trademark Office*